US009112479B2

(12) United States Patent
Yedlapalli et al.

(10) Patent No.: US 9,112,479 B2
(45) Date of Patent: Aug. 18, 2015

(54) FILTERING DISCRETE TIME SIGNALS USING A NOTCH FILTER

(75) Inventors: Satya Sudhakar Yedlapalli, Bangalore (IN); Kuchibhotla Venkata Subrahmanya Hari, Bangalore (IN)

(73) Assignee: Indian Institute of Science (IN)

( * ) Notice: Subject to any disclaimer, the term of this patent is extended or adjusted under 35 U.S.C. 154(b) by 599 days.

(21) Appl. No.: 13/265,288

(22) PCT Filed: Dec. 4, 2010

(86) PCT No.: PCT/IB2010/055584
§ 371 (c)(1),
(2), (4) Date: Oct. 19, 2011

(87) PCT Pub. No.: WO2012/052807
PCT Pub. Date: Apr. 26, 2012

(65) Prior Publication Data
US 2012/0185525 A1    Jul. 19, 2012

(30) Foreign Application Priority Data

Oct. 18, 2010   (IN) ............................ 3081/CHE/2010

(51) Int. Cl.
*G06F 17/10* (2006.01)
*H03H 17/02* (2006.01)

(52) U.S. Cl.
CPC ......... *H03H 17/025* (2013.01); *H03H 17/0285* (2013.01); *H03H 2017/0298* (2013.01); *H03H 2218/04* (2013.01)

(58) Field of Classification Search
None
See application file for complete search history.

(56) References Cited

U.S. PATENT DOCUMENTS

| | | | |
|---|---|---|---|
| 2005/0261898 A1* | 11/2005 | Van Klinken | 704/219 |
| 2011/0113082 A1* | 5/2011 | Alimohammad et al. | 708/316 |
| 2012/0185525 A1* | 7/2012 | Yedlapalli et al. | 708/318 |

OTHER PUBLICATIONS

International Search Report and Written Opinion issued by the Australian Patent Office in PCT/IB2010/055584, dated Mar. 9, 2011.
Yedlepalli et al., "The Canonic Linear-Phase Fir Lattice Structures", 2010 National Conference on Communications (NCC), Chennai, Jan. 29-31, 2010, p. 1-5.
Mahata, "Spectrum Estimation, Notch Filters, and Music", IEEE Transactions on Signal Processing, vol. 53, No. 10, Oct. 2005, p. 3727-3737.
Dattorro, "Effect Design, Part I: Reverberator and Other Filters", J. Audio Eng. Soc., vol. 45, No. 9, Sep. 1997, p. 660-684.
Jarvilehto, P., and Estola, K-P., "A New Modular VLSI Filter Architecture Using Computationally Efficient Recursive Digital Filter Topology," IEEE International Symposium on Circuits and Systems, 1988, pp. 1301-1304, vol. 2.

(Continued)

*Primary Examiner* — David H Malzahn
(74) *Attorney, Agent, or Firm* — Moritt Hock & Hamroff LLP; Steven S. Rubin, Esq.

(57) ABSTRACT

Various techniques are generally described for digital signal processing (DSP) such as discrete time filters. In some examples, a Canonic Filter Module (CFM) can be used to configure the discrete time filter using an LSF-Model with a finite length sequence. A single CFM can be configured to provide any type of discrete time filter used in signal processing. Filters can be modeled as a set of interconnected notch filters, a lattice structure of a discrete time filter is generally described that is based on a LSF-Model.

21 Claims, 11 Drawing Sheets

(56) References Cited

OTHER PUBLICATIONS

Harris, F., "Ultra low phase noise dsp oscillator," IEEE Signal Processing Magazine, Jul. 2007, pp. 121-124, vol. 24, issue 4.

Nguyen, T.Q and Vaidyanathan, P.P, "Two-channel perfect-reconstruction FIR QMF structures which yield linear-phase analysis and synthesis filters," IEEE Transactions on Acoustics Speech and Signal Processing, 1989, pp. 676-670, vol. 37, No. 5.

Oh, Y-J et al., "A Reconfigurable CSD FIR Filter Design using Dynamic Partial Reconfiguration," IEEE International Symposium on Proceedings, 2006, pp. 381-384.

Oh, Y-J et al., "Dynamic Partial Reconfigurable FIR Filter Design," Lecture Notes in Computer Science, 2006, pp. 30-35, vol. 3985.

Regalia, P. A. et al., "The digital all-pass filter: a versatile signal processing building block," Proceedings of the IEEE, Jan. 1988, pp. 19-37, vol. 76, No. 1.

Sayed, A. H. and Kailath, T., "A survey of spectral factorization methods," Numerical Linear Algebra with Applications, 2001, pp. 467-496, vol. 8, No. 6-7.

Vachhani, L. et al., "Efficient cordic algorithms and architectures for low area and high throughput implementation," IEEE Transactions on Circuits and Systems II: Express Briefs, 2009, pp. 61-65, vol. 56, No. 1.

Yedlapalli, S. S., et al., "The Line Spectral Frequency Model of a finite length sequence," IEEE Journal of Selected Topics in Signal Processing, 2010, pp. 646-658, vol. 4, No. 3.

* cited by examiner

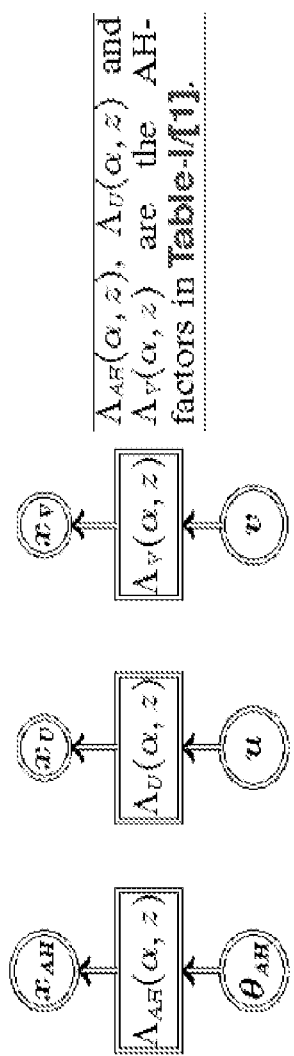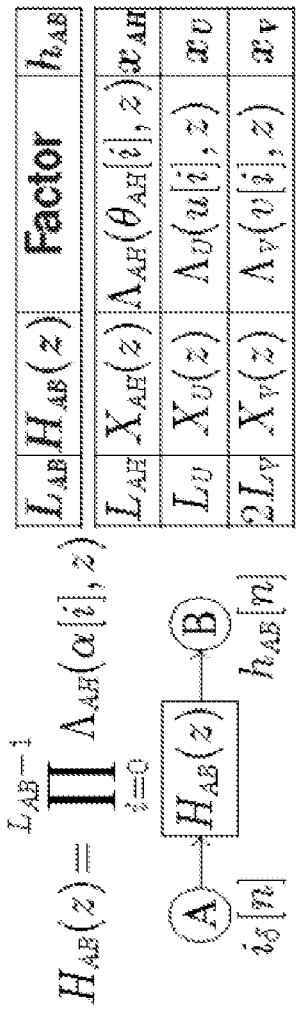
FIGURE 10A
FIGURE 10B

FILTERING DISCRETE TIME SIGNALS USING A NOTCH FILTER

CROSS-REFERENCE TO RELATED APPLICATIONS

The present application is a U.S. National Phase Application pursuant to 35 U.S.C. 371 of International Application No. PCT/IB2010/055584, filed on Dec. 4, 2010, which in turn claims priority under 35 U.S.C. 119(a) to Indian patent application serial number 3081/CHE/2010 filed on Oct. 18, 2010, the entire contents of which are herein incorporated by reference.

BACKGROUND

Digital signal processing (DSP) is a technical field concerned with the representation of continuous analog signals by a sequence of discrete numbers or symbols and the processing of such discrete sequences. DSP algorithms may be performed by standard computers, computing devices or microprocessors, by specialized processors called digital signal processors (DSPs), or on specialized hardware such as application-specific integrated circuit (ASICs). In addition, digital signal processing may be performed on more powerful general purpose microprocessors, field-programmable gate arrays (FPGAs), digital signal controllers (mostly for industrial application such as motor control), and stream processors, among others.

Oftentimes, a DSP system incorporates one or more digital filters. A digital filter is a system that performs mathematical operations on a sampled, discrete time signal (e.g. sequence of digital samples) to reduce or enhance certain aspects of that signal. For example, a high pass digital filter may be used to suppress or reduce low frequency components of a signal and enhance or amplify high frequency components. Conversely, a low pass digital filter may be used to suppress or reduce high frequency components of a signal and enhance or amplify low frequency components. A further example may be a notch digital filter that suppresses or reduces a specific frequency component or a small range of frequency components of a digital signal. An application for such a notch filter may be reducing the 60 Hz frequency component that is introduced as noise due to electrical power lines.

SUMMARY

The LSF-Model of a sequence translates a causal finite length sequence into sets of AH-sequences and a few complex constants based on a set of model parameters and a spectral decomposition principle. From the spectral decomposition principles used for LSF Models, a Canonic Filter Module (CFM) is identified, which can be configured to realize a finite impulse response which is an AH/MP/NP/SM/LP-sequence. A single CFM block may be configured to implement all types of discrete time filters. Further, the CFM can also be configured to realize any stable discrete time filter with a rational transfer function defined with finite number of zeros and poles.

The basic building block of a CFM is a notch filter with transfer function (i) $(1-e^{j2\pi\alpha}z^{-1})$, (ii) $(1-2\cos(2\pi\alpha)z^{-1}+z^{-2})$ defined by a single notch frequency at $2\alpha$ [radians]. As these two notch filter blocks are also lattice stages ((i) $L_U$, (ii) $L_V$), they are also robust to quantization noise. Hence the CFM structure is not only modular but also robust to quantization noise. As the CFM is a basic module of any discrete time filter, its optimal realization effectively results in an optimal realization of any discrete time filter. As the notch filter $L_U$ utilizes a Rotate-and-Accumulate (RAC) operation ($\alpha \neq \{\frac{1}{2}, 0\}$), one can also use CORDIC algorithms for realizing $L_U$. The notch filter $L_V$ requires a real Multiply-And-Accumulate (RMAC) operation. As Notch filters serve as basic building blocks in time domain filtering operations, we believe the Notch filters are as fundamental to filtering as NAND gates are to logic circuits. That is, as a NAND gate is a building block of any combinatorial logic circuit, a Notch filter defined by an LSF also serves as a basic building block of any discrete time filter (FIR/IIR).

Within embodiments described herein, a method for determining a digital filter structure is disclosed. The structure comprises a lattice filter structure derived from an LSF-Model of a causal finite length sequence. The structure can be implemented by a Canonic Filter Module (CFM) which uses two types of basic lattice stages that are notch filters defined by a single notch frequency. The filter structure, apart from its modularity, is also robust to coefficient quantization noise, which is desirable in many practical signal processing systems. Further, the notch filter lattice structures are each configured with a single input node and single output node.

One method described herein includes obtaining a transfer function for a digital filter in the form of one or more filter components. The filter components include an annihilating component, a minimum phase component, a non-minimum phase component, and a symmetric component, although not every component may be present for a given desired filter. Each filter component is implemented as a set of interconnected notch filters. In addition, each set of notch filters may include at least one of a first notch filter having a half-lattice structure and a second notch filter having a full lattice structure.

The method may further include implementing each filter component as a series and/or parallel combination of one or more first notch filters and one or more second notch filters. For example, the annihilating component may be a series combination of one or more first notch filters and one or more second notch filters. As another example, the minimum phase component, the non-minimum phase component, and the symmetric component may be a parallel or series-parallel combination of one or more first notch filters and one or more second notch filters. Additionally, the method may include decomposing a filter component, such as the minimum phase component, the non-minimum phase component, and the symmetric component, into annihilating subcomponents such that the annihilating subcomponents include one or more first notch filters and one or more second notch filters.

Also, the method may include using a canonic filter module structure to define or implement at least one of the annihilating component, the minimum phase component, the non-minimum phase component, and the symmetric component. Further, the method may determine lattice coefficients of the first notch filter and the second notch filter for each set of notch filters. In addition, the method may generate a data structure defining the digital filter structure.

Another embodiment of the present disclosure includes a device for filtering digital signals. The device may include a processor having one or more function modules. The function modules may include an annihilating function module, a minimum phase function module, a non-minimum phase function module, and a symmetric function module. Further, each function module may include a set of interconnected notch filters such that each set of notch filters includes at least one of a first notch filter having a half-lattice structure and a second notch filter having a full lattice structure. In addition, the device may include a memory coupled to the processor and storing sets of half-lattice and full-lattice coefficients respectively corresponding to each set of interconnected notch filters.

The function modules may include series and/or parallel or series-parallel combination of one or more first notch filters and one or more second notch filters. For example, the annihilating function module may include a series combination of one or more first notch filters and one or more second notch filters. As another example, the minimum phase function module, the non-minimum phase function module, and the symmetric function module may include a series, parallel, or a series-parallel combination of one or more first notch filters and one or more second notch filters. Further, the device may include a canonic filter function module configured to be a function module such as an annihilating function module, a minimum phase function module, a non-minimum phase function module, and a symmetric function module.

Additionally, the first notch filter having a half-lattice structure may include a first delay circuit, a first multiplier circuit, and a first adder circuit. Alternatively, the second notch filter having a full-lattice structure may include a second delay circuit and a third delay circuit, a second multiplier circuit and a third multiplier circuit, and a second adder circuit, a third adder circuit, and a fourth adder circuit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 10A and 10B are examples of AH sequence synthesis;

DETAILED DESCRIPTION

Figure 1:
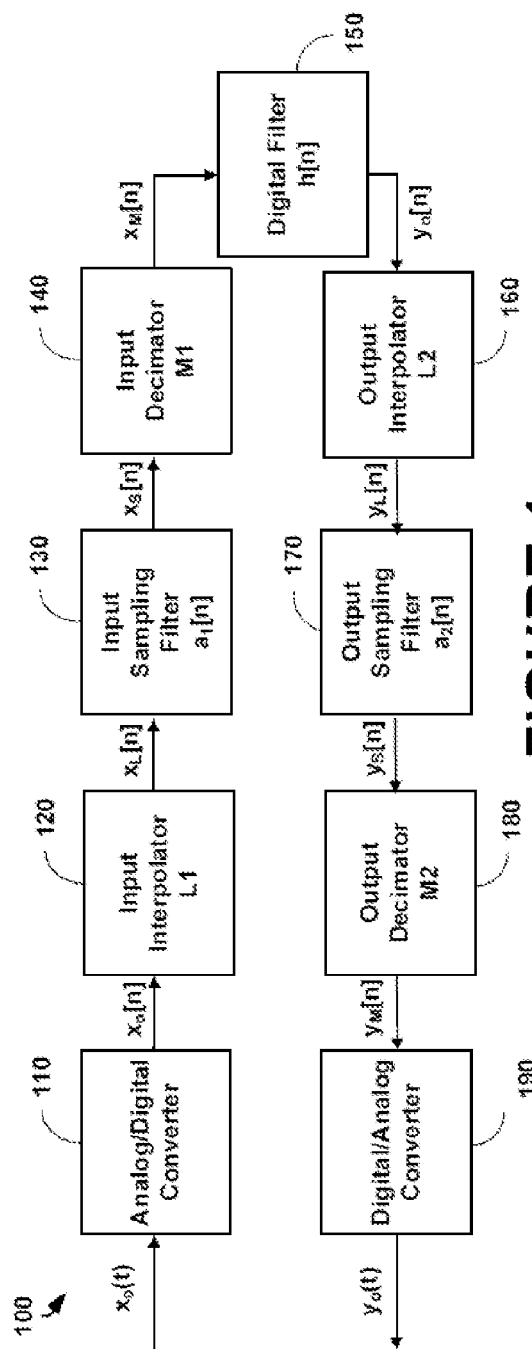
FIG. 1 is a functional block diagram of a digital signal processing system for use with filters described herein.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 is a functional block diagram of an example digital signal processing (DSP) system that utilizes the filter structures described herein. The DSP system 100 is configured to receive a continuous time analog signal $x_o(t)$. Examples of continuous time analog signals may be voice or audio, sonar or radar, images, biomedical, or seismic signals. An Analog-to-Digital Converter (ADC) 110 may be configured to receive and convert the continuous analog signal $x_o(t)$ into a discrete time signal $x_o[n]$ which may also be described as a sequence of digital samples. The ADC 110 can be configured to sample the analog signal $x_o(t)$ at a sampling rate of 1/T1 samples per second. Further, the discrete time or digital signal $x_o[n]$ can be received by an Input Interpolator 120. Interpolation can be utilized to effectively increase the sampling rate of captured data by determining or estimating a sample value that occurs at a time between two of the original discrete time samples. An input up-sampling factor for the Input Interpolator 120 may be L1. Additionally, the output of the Input Interpolator 120 may be a signal $x_L[n]$, which may be provided to the Input Sampling Filter 130. The Input Sampling Filter 130 may be configured as an anti-aliasing or anti-imaging filter. Such aliasing and imaging effects may be introduced during one or more processes such as the digital conversion, interpolation, or decimation processes. The impulse response of the Input Sampling Filter 130 may be $a_1[n]$, where such that the Input Sampling Filter 130 is configured to provide a digital signal $x_S[n]$ in response to signal $x_L[n]$ in accordance with the impulse response $a_1[n]$. Further, an Input Decimator 140 can be configured to receive the digital signal $x_S[n]$. Decimation is the process of reducing a sampling rate of a discrete-time signal. In practice, Decimation may also include filtering (e.g. low-pass) a signal, then discarding a subset of samples of a discrete sequence. Decimation may reduce the computation and memory resources needed for digital signal processing. An input down-sampling factor for the Input Decimator 140 may be M1.

The output of the Input Decimator 140 is configured to generate an output signal $x_M[n]$ in response to digital signal $x_S[n]$. Signal $x_M[n]$ can be provided to a Digital Filter 150 having an impulse response h[n], which may be configured to responsively generate an output digital signal $y_o[n]$. The transfer function for the Digital Filter 150 may be given as H(z), which is the z-transform of the impulse response h[n]. The Digital Filter 150 may be any appropriate variety of filter functions such as a low-pass filter, a high-pass filter, a band-pass filter, a notch filter, for example, or any other filter that may be used to reduce or enhance certain aspects of the digital signal $x_M[n]$ in the digital signal processing system 100. Further, the output digital signal, $y_o[n]$ of the Digital Filter 150 may be provided to an Output Interpolator 160, which may have an up-sampling factor L2. Output Interpolator 160 may be configured to output digital signal $y_L[n]$ in response to digital signal $y_o[n]$, where digital signal $y_L[n]$ may be provided to an Output Sampling Filter 170. As with the Input Sampling Filter 130, the Output Sampling Filter 170 may be used to reduce aliasing and imaging effects introduced during the digital conversion, decimation, or interpolation process. An impulse response for the Output Sampling Filter 170 may correspond to $a_2[n]$. Output Sampling Filter 170 may be configured to output digital signal $y_s[n]$ in response to digital signal $y_L[n]$ in accordance with the impulse response $a_2[n]$. Digital signal $y_s[n]$ can be provided to an Output Decimator 180, with a down-sampling factor of M2 which responsively outputs signal $y_M[n]$. The output signal of the Output Interpolator, $y_M[n]$, may be provided to a Digital-to-Analog Converter (DAC) 190, which may responsively convert the digital or discrete time signal $y_M[n]$ to a continuous time analog signal $y_o(t)$. One or more of the filtering operations performed by filter modules 130, 150, and 170 may be adapted to use the filter structures described herein.

Further details of the methods and systems described herein may be found later in the specification section entitled "Properties and Further Examples of the Canonic Lattice Filter Structures Based on Notch Filters." Furthermore, in the following description, much of the mathematical justification for the filter derivation may be found in "The Line Spectral Frequency Model of a Finite-Length Sequence" by Yedlapalli, S. S.; Hari, K. V. S.; IEEE Journal of Selected Topics in Signal Processing, Volume 4, Issue 3, pp 646-658 (2010), the contents of which are hereby incorporated herein by reference for all purposes, and are referred to herein as "the LSF Model publication". This publication is also referenced herein by way of the following notation: "/[1]", wherein, for example, a reference to "property 8/[1]" refers to property 8 as described in the LSF Model publication.

In the LSF model publication, a spectral decomposition of finite length sequences is described. The filter structures described herein make use of the LSF spectral decomposition techniques by applying them to the impulse response sequence of a desired FIR filter.

Annihilating sequences, or AH sequences, are basic sequences. The AH sequences $\{\chi_{AH}, \chi_U, \chi_V\}$ can be synthesized by cumulative convolution operation of basic sequences defined by the LSFs $\{\theta_{AH}, u, v\}$ as in FIG. 10A. Specifically, from Property-8/[1], the AH-sequence $\chi_{AH}$ can be obtained directly by a cumulative convolution operation using $L_{AH}$ factors of the type $\Lambda_{AH}(\theta_{AH}[l], z)$. The sequence can also be obtained as the convolution of $\chi_U$ and $\chi_V$ with $\{\chi_U, \chi_V\}$ obtained independently with the cumulative convolution of $\Lambda_U(u[l], z)$ and $\Lambda_V(v[l], z)$.

Alternately, from linear system theory one can also use a non-recursive discrete time system which can use difference equations to generate AH-sequences. The non-recursive discrete time filter in FIG. 10B with transfer function $H_{AB}(z)$ between node A and node B can be used to generate the sequence $h_{AB}$ as a response to an impulse input. In scalar synthesis, the AH-sequences can be synthesized as the impulse response of an FIR filter, where the filter is a cascade (i.e., series coupling) of the basic AH-factors defined by the corresponding LSFs, where $i_\delta:(L_{AB}+1)]$ is an impulse sequence with $i_\delta[0]=1$, $i_\delta[n]=0$ for $1 \le n \le L_{AB}$.

Figure 4:
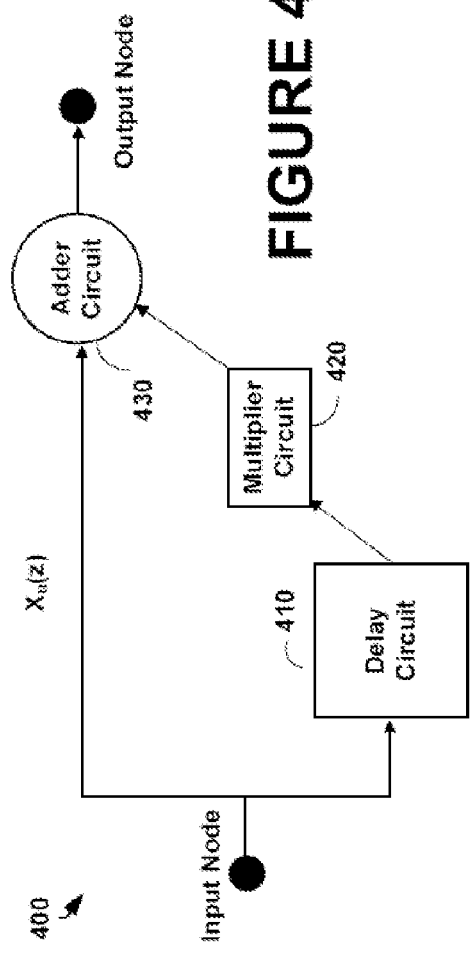
FIGS. 4 and 5 are functional block diagrams of example single port notch filters.
Figure 5:
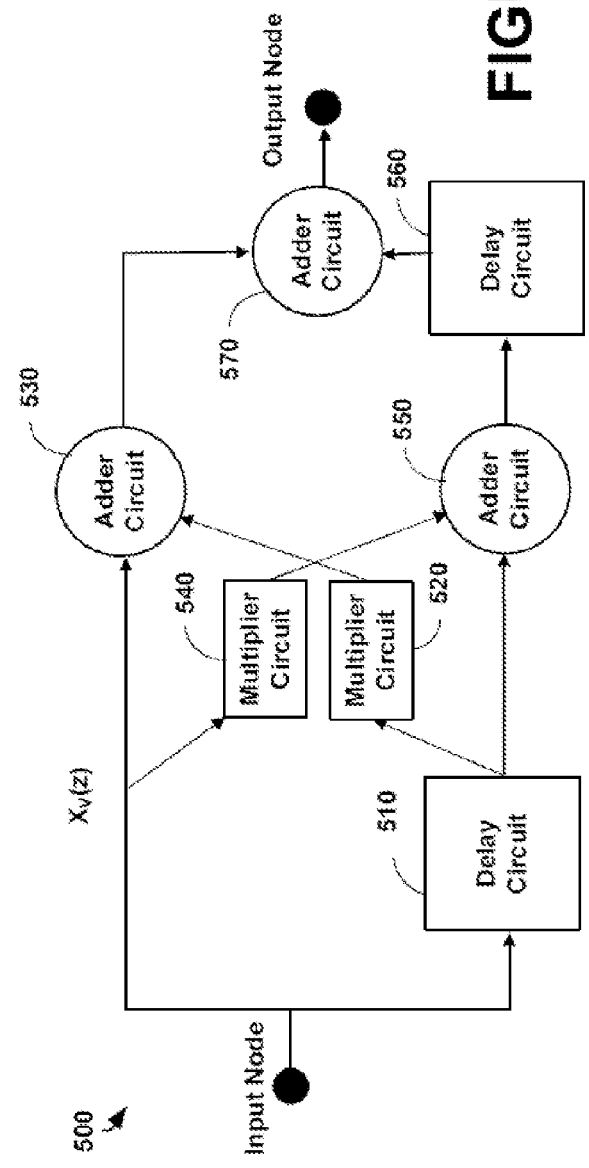

An LTI system with transfer function as $\Lambda_{AH}(\alpha, z)$ can be recognized as a Notch filter with spectral null at $f=\alpha$. FIGS. 4 and 5, as discussed below, show that the two basic AH-factors (Notch filters) are also the transfer functions of lattice blocks $L_U$ and $L_V$, which are robust to quantization noise.

Figure 2:
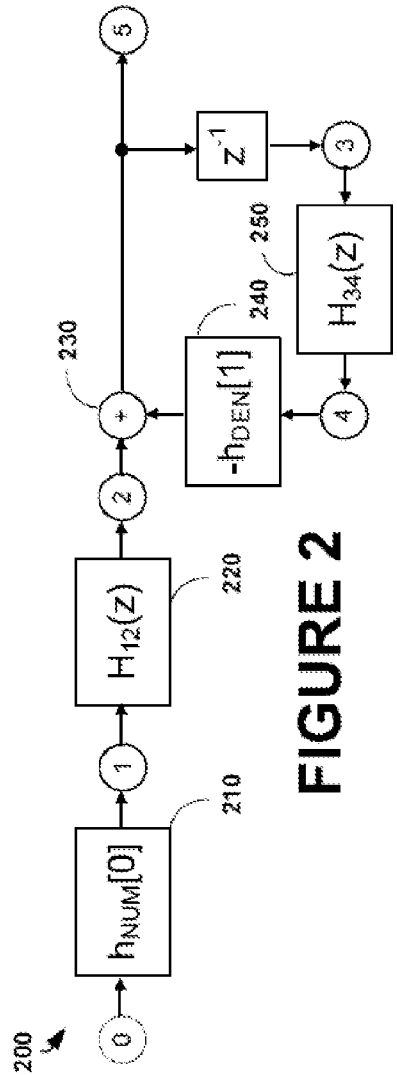
FIG. 2 is a functional block diagram of an implementation of a rational transfer function for use with filters described herein.

In addition, the LSF decomposition and generation of digital filters may be extended to any rational transfer function. FIG. 2 depicts an implementation of a rational transfer function between node 0 and node 5 with a transfer function $H_{05}(z)=H_{NUM}(z)/H_{DEN}(z)$, which is adapted in accordance with at least some embodiments described herein. This can be written as $h_{NUM}[0]H_{12}(z)/H_{DEN}(z)$ such that $h_{12}[0]=1$. Further, it can be seen that the transfer function between nodes 2 and 5 of FIG. 2 is $H_{25}(z)=1/H_{DEN}(z)$, with the denominator rewritten in the form $H_{DEN}(z)=1+h_{DEN}[1]z^{-1}H_{34}(z)$ with $h_{DEN}[1] \ne 0$. In this way, any rational transfer function $H_{NUM}(z)/H_{DEN}(z)$ may be rewritten in terms of $H_{12}(z)$ and $H_{34}(z)$, which are in turn and implemented using the filter structures described herein.

Figure 3A:
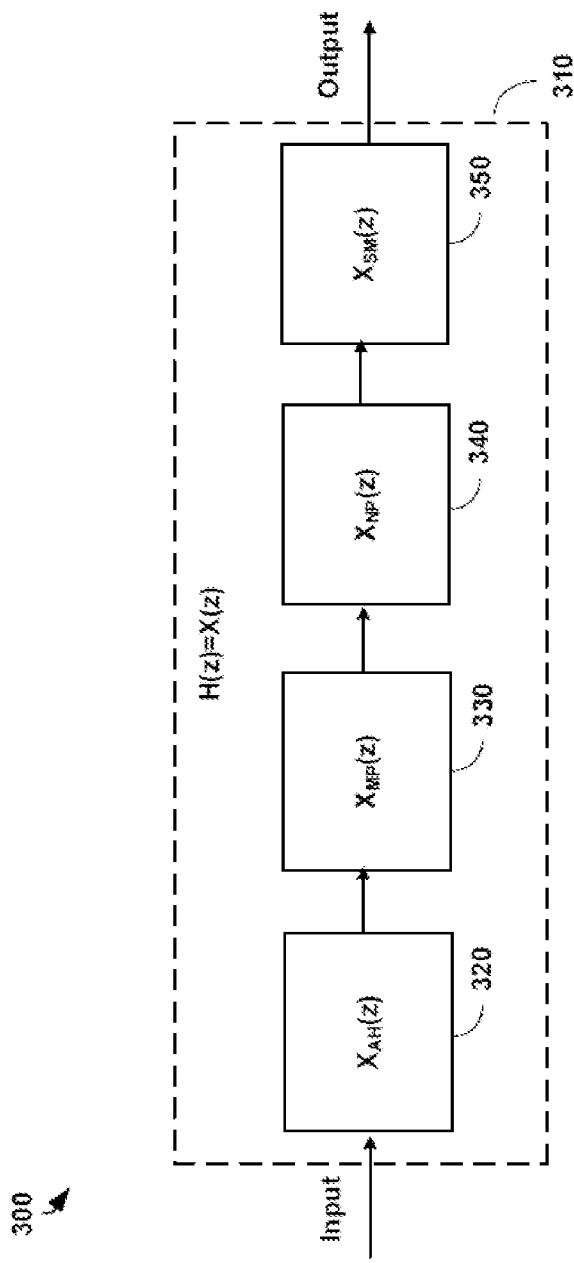
FIG. 3A is a functional block diagram of an example digital filter.

FIG. 3A is a functional block diagram 300 of an example digital filter that is arranged in accordance with at least some embodiments described herein. Digital filter 310 has a transfer function $H(z)=X(z)$. Further, the digital filter 310 comprises up to four digital filter components including an annihilating component, minimum phase component, non-minimum component, and symmetric component with transfer functions, $X_{AH}(z)$ 320, $X_{MP}(z)$ 330, $X_{NP}(z)$ 340, and $X_{SM}(z)$ 350, respectively. The transfer function for the digital filter 310, $H(z)=X(z)$ is a polynomial with respect to the variable z and may be decomposed into four components such that $X(z)=X_{AH}(z)X_{MP}(z)X_{NP}(z)X_{SM}(z)$ using LSF modeling of a sequence corresponding to the filter impulse response.

As set forth in more detail in the LSF Model Publication, identifying the various polynomial components may be achieved by factoring and finding the roots for the polynomial $X(z)$. This may be done using a root-finding software utility program running on a microprocessor. Numerous utilities exist including the function "roots( )" in the Matlab® software from The Mathworks, Inc. Software is then used to group the roots into the various filter function modules, or components, as described in the LSF model publication with respect to a polynomial corresponding to a finite sequence. The roots of a polynomial, which in this case correspond to the transfer function $X(z)$, may lie within the unit circle of the z-domain, on the unit circle of the z-domain, or outside the unit circle in the z-domain. Roots of $X(z)$ that lie on the unit circle may be grouped together to be the annihilating filter component $X_{AH}(z)$ 320. A root, or zero, on the unit circle corresponds to suppressing or reducing a frequency component that corresponds to that frequency in the frequency response of the annihilating filter component $X_{AH}(z)$ 320. Thus, the annihilating filter component may be characterized as one or more notch filters. Hence, the name "annihilating" filter component for such a digital filter.

Alternatively, roots of $X(z)$ that are complex conjugates of each other such that one root lies within the unit circle and one root lies outside the unit circle are grouped together to be the symmetric filter component $X_{SM}(z)$ 350. Further, roots of $X(z)$ that are within the unit circle (with no corresponding complex conjugate) may be grouped together to be the minimum phase filter component $X_{MP}(z)$ 330. In addition, roots of $X(z)$ that are outside the unit circle (with no corresponding complex conjugate) may be grouped together to be the non-minimum phase filter component $X_{NP}(z)$ 340. Details of the annihilating, minimum phase, non-minimum phase, and symmetric filter components will be discussed when describing FIG. 3B and table 1, below. While the annihilating, minimum phase, non-minimum phase, and symmetric filter components may be cascaded to implement the digital filter 310, each filter component may be used individually as a filter or with a subset of the other filter components to implement any type of digital filter.

The principle of scalar synthesis can be used to translate the vector synthesis structures of the LSF-models $\{\chi^{MP}, \chi^{NP}, \chi^{SM}\}$ in [1] to LTI systems with impulse responses as $\{\chi_{MP}, \chi_{NP}, \chi_{SM}\}$. These LSF-models (FIG. 4/[1], FIG. 5/[1], FIG. 6/[1]) require the knowledge of their roots $\{\rho_{MP}, \rho_{NP}, \rho_{SM}\}$ and a choice of the model parameters $\{\mu, \lambda\}$ [1].

Figure 3B:
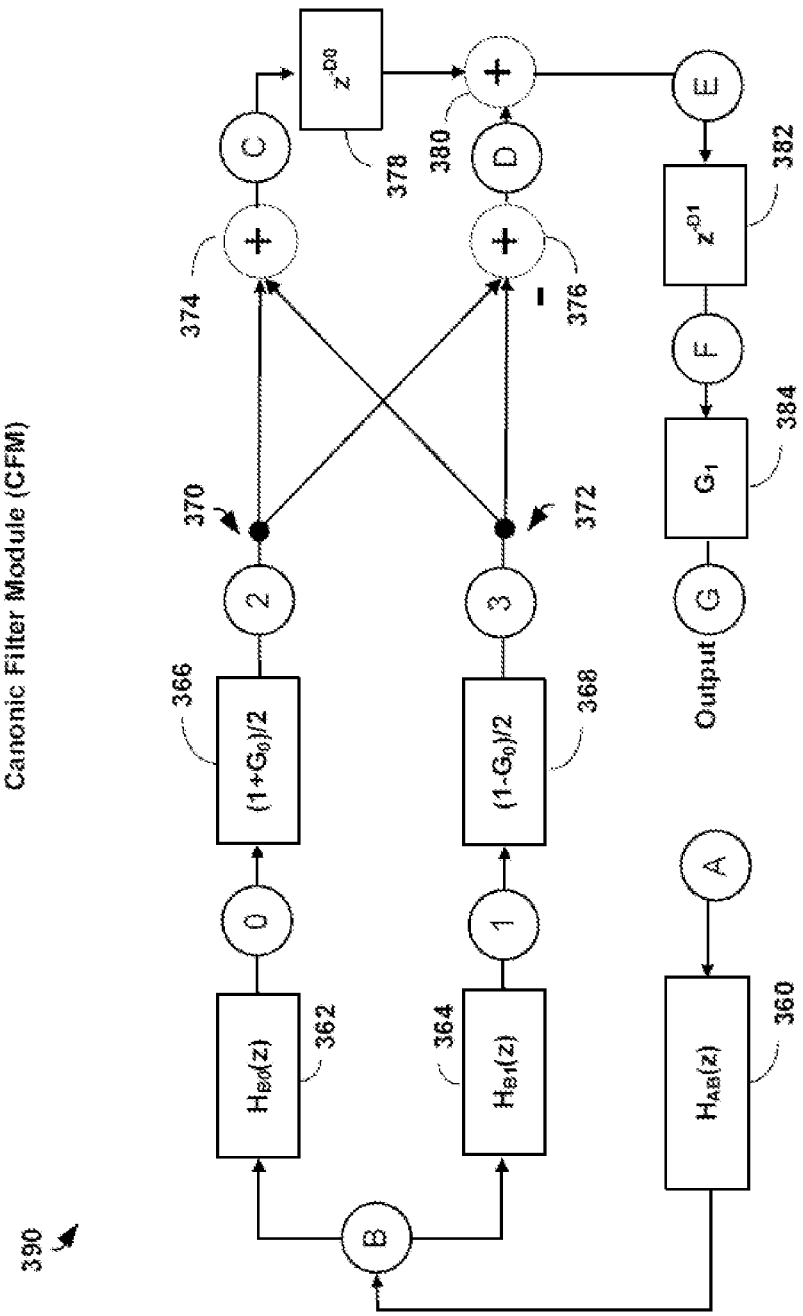
FIG. 3B is a functional block diagram of a canonical form of a digital filter module.

FIG. 3B is a functional block diagram for an example canonic filter module (CFM) 390, in accordance with at least some examples described herein. The CFM 390 can implement each of the annihilating filter component, the minimum phase filter component, the non-minimum phase filter component, and the symmetric filter component, individually. The CFM 390 has several filter components and filter sub-components, delay circuits, adder circuits, and amplifier or multiplier circuits. Further, the CFM 390 may be implemented by a digital signal processor ASIC, FPGA, or any other specialized processor that may be used to implement each filter component, delay circuit, adder circuit, and amplifier or multiplier circuit shown in FIG. 3B. Note that as used herein, the transfer function between node-i and node-j is denoted as $H_{ij}(z) = X_j(z)/X_i(z)$ with impulse response as $h_{ij}$.

The CFM 390 of FIG. 3B includes the following: a transfer function $H_{AB}(z)$ 360 with finite length impulse response as $[h_{AB}: (L_{AB}+1)]$(or simply $h_{AB}$); a transfer function $H_{B0}(z)$ 362 with finite length impulse response as $[h_{B0}: (L_{B0}+1)]$(or $h_{B0}$); a transfer function $H_{B1}(z)$ 364 with finite length impulse response as $[h_{B1}: (L_{B1}+1)]$(or $h_{B1}$); complex gains $G_0$ 366 and $G_1$ 368; and, delays $D_0$ 378 and $D_1$ 382. Each of the transfer functions are derived as described herein so as to be annihilating transfer functions, and hence are implemented as cascaded single-node notch filter structures. That is, each of the filter components 360, 362, and 364 described above may be decomposed into various interconnected combinations of two types of notch filters. One type of notch filter may have a half-lattice digital filter structure and another type of notch filter may have a full-lattice digital filter structure. Details of the types of notch filters will be discussed when describing FIGS. 4 and 5, and are summarized in Table A.

TABLE A $$\boxed{0} \to \boxed{\Lambda_U(u[0], z)} \to \boxed{A} \to \boxed{\cdots} \to \boxed{B} \to \boxed{\Lambda_U(u[L_U-1], z)} \to \boxed{1}$$

The transfer function, $H_{01}(z) = X_U(z)$(Table-II/[1]) is realized as a cascade of
$L_u$ blocks of type $L_U$, each with transfer function $\Lambda_U(u[l],z)$ defined by lattice coefficient $k_U[l] \triangleq -e^{j2\pi u[l]}$. Here the LSFs $[u:L_U]$ map to a sequence of reflection coefficients $[k_U:L_U]$. Here $h_{01} = x_U$.
a: Lattice Structure for $X_U(z)$ $$\boxed{1} \to \boxed{\Lambda_v(v[0], z)} \to \boxed{P} \to \boxed{\cdots} \to \boxed{Q} \to \boxed{\Lambda_v(v[L_v-1], z)} \to \boxed{2}$$

The transfer function, $H_{12}(z) = X_v(z)$(Table-II/[1]) is realized as a cascade of $L_v$ blocks of type $L_V$ each with transfer function $\Lambda_v(v[l],z)$ defined by lattice coefficient $k_v[l] - \cos(2\pi v[l])$. Here the LSFs $[v:L_v]$ map to a sequence of reflection coefficients $[k_v:L_v]$. Here $h_{12} = x_v$.
b: Lattice Structure for $X_V(z)$ $$\boxed{0} \to \boxed{\frac{[k_U:L_U]}{X_U(z)}} \to \boxed{1} \to \boxed{\frac{[k_v:L_v]}{X_v(z)}} \to \boxed{2}$$

The transfer function, $H_{02}(z) = H_{AH}(z)$ is realized as a cascade of $H_{01}(z) = X_v(z)$. Here $h_{02} = x_{AH}$. The Example-2 illustrates this lattice structure.
c: Lattice Structure for $X_{AH}(z)$ The annihilating filter component may be a series combination of one or more half-lattice notch filters and one or more full-lattice notch filters. Further, the minimum phase component 330, the non-minimum phase component 340, and the symmetric component 350 may be a series and a parallel combination of one or more half-lattice notch filters and one or more full-lattice notch filters. A series combination of filters is one in which the filters are configured such that an output of a first filter is provided as an input to a second filter. A parallel combination of filters is one in which one or more filters are configured to each receive the same input and wherein the respective outputs are coupled and/or combined. A series-parallel configuration is one in which at least one branch of a parallel filter may itself be one or more series combinations of filters, or may be one in which one or more filters are coupled in series together with one or more parallel combinations of filters. Let $N_U$ and $N_V$ denote the number of lattice blocks of type $L_U$ and $L_V$ used in a CFM block.

The operation and implementation of the example CFM shown in FIG. 3B may be described as follows. The filter component 360 may be configured to receive an input signal and couple a resulting processed signal to both filter 362 and filter 364. The output of filter 362 and 364 are coupled to gain units 366 and 368 respectively. The gain coefficient values are $(1+G_0)/2$ and $(1-G_0)/2$ as shown. The resulting output signals from gain circuits (or software modules) 366 and 368 are coupled to adder circuit 376 and a difference is calculated. The resulting signal is coupled to an adder circuit 380. In addition, the resulting output signals from amplifier circuits 365 and 368 are coupled to adder circuit 374 and added to each other. The resulting signal is coupled to delay circuit 378. Adder circuit 380 is configured to receive signals from delay circuit 378 and adder circuit 376 and adds the signals together. The resulting signal is delayed a $D_1$ interval by delay circuit 382 and coupled to amplifier or multiplier circuit 384. The received signal is amplified by a gain or coefficient of $G_1$. The resulting signal from amplifier circuit 384 is the output signal for the CFM 390. The parameter $G_0$ and $G_1$ may be related to the coefficients of the transfer function of the CFM 390.

Figure 3C:
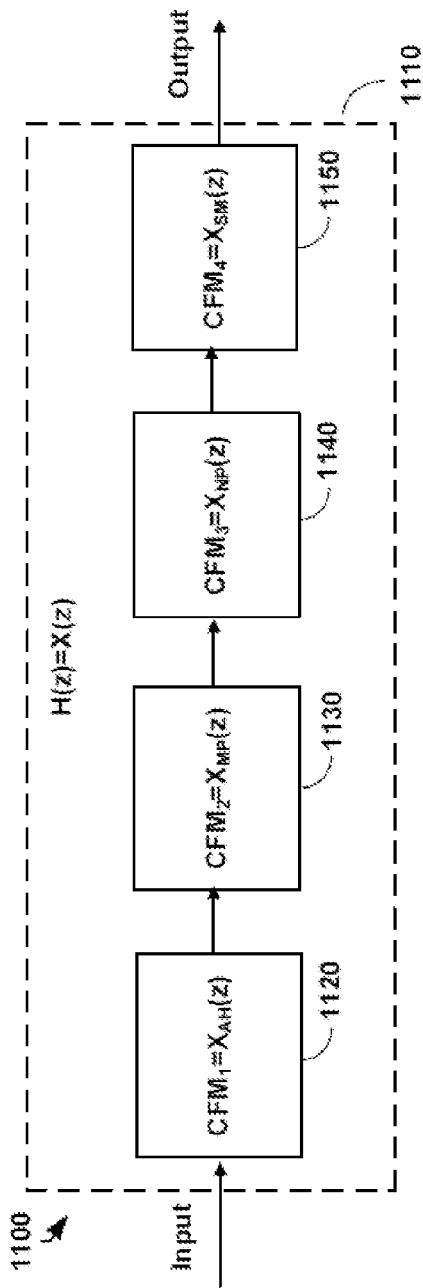
FIG. 3C is a circuit block diagram of one implementation of a digital filter.
Figure 3D:
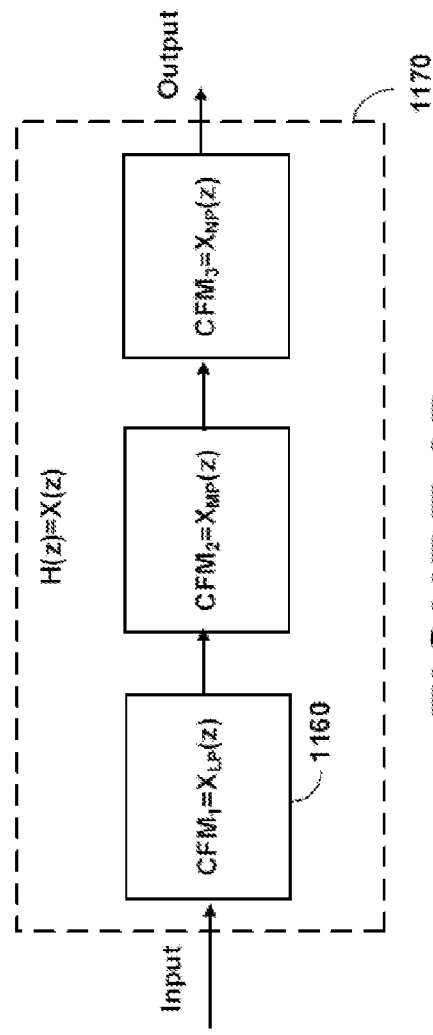
FIG. 3D is a circuit block diagram of another implementation of a digital filter.

The CFM 390 of FIG. 3B may be used to implement any one of an annihilating filter component, a minimum phase filter component, a non-minimum phase filter component, or a symmetric filter component. FIG. 3C is a functional block diagram 1100 for an example digital filter using canonic filter modules. The transfer function for the digital filter 1100 may be X(z). As discussed in describing FIG. 3A, the transfer function X(z) may be decomposed into an annihilating filter component $X_{AH}(z)$, a minimum phase filter component $X_{MP}(z)$, a non-minimum phase filter component $X_{NP}(z)$, and a symmetric component $X_{SM}(z)$. Moreover, each filter components may be implemented by a CFM as discussed when describing FIG. 3B. Thus, the digital filter 1100 with transfer function X(z) may be realized by cascading (i.e., a series coupling) a CFM 1120 implementing an annihilating filter component, a CFM 1130 implementing a minimum phase filter component, a CFM 1140 implementing a non-minimum phase filter component, and a CFM 1150 implementing a symmetric filter component. In an alternative embodiment, the CFM structures may be configured so that the annihilating filter component $X_{AH}(z)$ and the symmetric component $X_{SM}(z)$ are combined in a single CFM, represented as $X_{LP}(z)$. Table B below summarizes the various configurations of the CFM filter device according to the filter component being implemented.

TABLE B

Transfer Functions $$H_{B2}(z) = \left(\frac{1}{2}\right) H_{B0}(z)(1+G_0), \quad H_{B3}(z) = \left(\frac{1}{2}\right) H_{B1}(z)(1-G_0)$$

$$H_{BC}(z) = H_{B2}(z) + H_{B3}(z), \quad H_{BD}(z) = H_{B2}(z) - H_{B3}(z)$$
$$H_{BE}(z) = [z^{-D_0} H_{BC}(z) + H_{BD}(z)], \quad H_{EG}(z) = G_1 z^{-D_1}$$

TABLE B-continued

Transfer Functions $H_{AG}(z) = H_{AB}(z)H_{BE}(z)H_{EG}(z)$
$\underline{C_{AH}}$:Configuration of block C F M for $\chi^{AH}$ (in Fig. 3/[1])

$H_{AB}(z) = X_{AH}(z)$ with only two nodes {[A], [B]}

The Example-3 illustrates this lattice structure.
$\underline{C_{MP}}$:Configuration of block C F M for $\chi^{MP}$ (in Fig. 4/[1])

with un-used nodes {[A], [E], [F], [G]}.

From Fig. 4/[1]. $x_{MP}$ is mapped to two AH-sequences $x_{MP}^{\pm}$(LSF-MP-1 for simplicity) with LSFs as $\theta_{\pm}^{MP}$.
 Here $H_{B0}(z) = X_{MP}^+(z); H_{B1}(z) = X_{MP}^-(z); G_0 = G_{MP}$;
 $H_{BC}(z) = X_{MP}(z); H_{BD}(z) = \Omega(\mu_{MP}\lambda_{MP},z)X_{MP}^{\pm}(z)$ ;
 The Example-4 illustrates this lattice structure.
$\underline{C_{NP}}$:Configuration of block C F M for $\chi^{NP}$ (in Fig. 5/[1])

with un-used nodes as; {[A], [C]},

From Fig. 5/[1]. $\alpha_{MP}$ is mapped to two AH-sequences $\alpha_{MP}^{\pm}$(LSF-NP-1 for simplicity) with LSFs as $\theta_{\pm}^{NP}$.
 Here $H_{B0}(z) = A_{MP}^+(z); H_{B1}(z) = A_{MP}^-(z); G_0 = G_{MP}; G_1 = K_{NP}$;

$H_{BG}(z) = \Omega(\mu_{MP}\lambda_{MP} + D_1, z)X_{NP}(z)$. $D_0 = \infty$ i.e. node [D] connects directly to [E] or addition is bypassed.

$D_1 \geq 0$ is an additional delay other than $\lambda_{MP}$ of $\chi_{MP}$.
The Example-5 illustrates this lattice structure.
$C_{SM}$:Configuration of block C F M for $\chi_{SM}$ (in Fig. 6/[1]) with un-used node [A].

Figure 6:
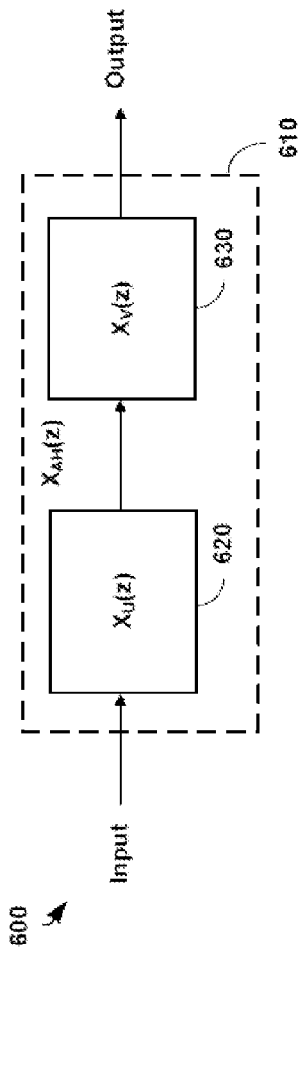
FIG. 6 is a functional block diagram of an example digital filter.

From Fig. 6/[1]. $\alpha_{MP}$(of $\chi_{SM}$ Theorem-1/[1]) is mapped to two AH-sequences $\alpha_{MP}^{\pm}$(LSF-SM-1 for simplicity) with LSFs as $\theta_{\pm}^{SM}$.
 Here
 $H_{B0}(z) = A_{MP}^+(z); H_{B1}(z) = A_{MP}^-(z); G_0 = G_{MP}; G_1 = K_{SM}; D_0 = L_{SM}^1 = (L_{SM} +$
 $H_{B0}(z) = \Omega(0, \lambda_{MP} + D1,z)X_{SM}(z)$
 $D_1 \geq 0$ is an additional delay other than $\lambda_{MP}$ of $\chi^{MP}$.
 The Example-6 illustrates this lattice structure.
$C_{LP}$:Configuration of block C F M for $\chi^{LP}$
 As in $C_{AH}$ and $C_{SM}$ with $H_{AG}(z) = \Omega(0,\lambda_{MP} + D1,z)X_{LP}(z)$
 Example-7 to Example-9 illustrate this lattice structure.

An annihilating filter component may be implemented through the use of block 360 where $H_{AB}(z)=X_{AH}(z)$, which corresponds to the portion of the CFM structure from node A to node B. The transfer function of the annihilating filter component may be $X_{AH}(z)$ and may be referred to an annihilating transfer function. The impulse response for such a transfer function may be referred to an annihilating sequence $x_{AH}[n]$. The digital filter may be implemented by cascading (i.e., a series coupling) a digital filter having a transfer function $X_U(z)$, and a digital filter having a transfer function $X_V(z)$. The digital filter with transfer function $X_U(z)$ may be a combination of the half-lattice notch filters as shown in FIG. 4 while the digital filter with transfer function $X_V(z)$ may be a combination of full-lattice notch filters as shown in FIG. 5.

An annihilating transfer function has roots on the unit circle in the z-domain. Thus, an annihilating sequence or annihilating transfer function may be characterized by $[\theta_{AH}, L_{AH}]$ where $L_{AH}$ is the number of roots for the annihilating transfer function and $\theta_{AH}$ is the roots of the annihilating transfer function such that the root is given by $e^{j2\pi\theta_{AH}[1]}$ which implies $X_{AH}(f)=0$ for $f=\theta_{AH}$.

For example, an annihilating sequence, $x_{AH1}[n]$ may be given as $[\theta_{AH}, 6]=\{0.07, 0.18. 0.2, -0.2, 0.36, -0.36\}$. The annihilating transfer function $X_{AH1}(z)$ that corresponds to the annihilating sequence $x_{AH1}[n]$ has six roots that includes two single roots (0.07 and 0.18) and two conjugate pairs (0.2, -0.2, 0.36, and -0.36). Each single root (0.07 and 0.18) can be characterized as transfer function for a half-lattice notch filter. Further, each conjugate pair may be characterized as transfer function for full-lattice notch filter. The two half-lattice notch filters may be cascaded together to form a digital filter 620 with transfer function $x_U(z)=(z-e^{j2\pi(0.07)})(z-e^{j2\pi(0.18)})$ where the transfer function for one half-lattice notch filter is $(z-e^{j2\pi(0.07)})$ and the transfer function for the other half-lattice notch filter is $(z-e^{j2\pi(0.18)})$. One half-lattice notch filter is configured to suppress or reduce the frequency component at f=0.07 and the other half-lattice notch filter is configured to suppress or reduce the frequency component at f=0.18. The half-lattice coefficients may be calculated as $K_{U1}=-e^{j2\pi(0.07)}=1\angle(-0.43)$ and $K_{U2}=-e^{j2\pi(0.18)}=1\angle(-0.32)$.

Alternatively, the two full-lattice notch filters may be cascaded together to form a digital filter with transfer function $X_V(z)=(z-e^{j2\pi(0.2)})(z-e^{j2\pi(-0.2)})(z-e^{j2\pi(0.36)})(z-e^{j2\pi(-0.36)})$ where one transfer function for one full-lattice transfer function is $(z-e^{j2\pi(0.2)})(z-e^{j2\pi(-0.2)})$ and the transfer function for the other full-lattice transfer function is $(z-e^{j2\pi(0.36)})(z-e^{j2\pi(-0.36)})$. One full-lattice notch filter is configured to suppress or reduce frequency components at f=-0.2 and f=0.2 and the other full-lattice notch filter is configured to suppress or reduce frequency components at f=-0.36 and f=0.36. The full-lattice coefficients may be calculated as $K_{V1}=-\cos(2\pi(0.2))=-0.30902$ and $K_{V2}=-\cos(2\pi(0.36))=0.63742$.

This example may therefore be summarized as follows:
The AH-sequence with LSFs as $[\theta_{AH}: 6]=\{0.07, 0.18, 0.2, -0.2, 0.36, -0.36\}$.
Here $[u:2]=\{0.07, 0.18\}$ and $[v:2]=\{0.2, 0.36\}$ and the corresponding AH-sequences are as follows:
$[x_{AH}: 7]=\{1, 1.49148\angle(-0.3246), 0.36087\angle(0.05678), 1.35201\angle(-0.375), 0.36087\angle(0.19322), 1.49148\angle(-0.4254), 1\angle(0.25)\}$; $L_{AH}=6$;
$[x_U: 3]=\{1, 1.88176\angle(-0.375), 1\angle(0.25)\}$; $L_U$ 2;
$[x_V: 5]=\{1, 0.65681, 1.2121, 0.6568 1, 1\}$; $L_V=2$;
For the AH-sequences the reflection coefficients are:
$[k_U: 2]=\{1\angle(-0.43), 1\angle(-0.32)\}$;
$[k_V: 2]=\{-0.30902, 0.63742\}$;

The example filter module implemented on CFM may be a minimum phase filter component, which has a minimum phase transfer function $X_{MP}(z)=1+a_1z^{-1}+a_2z^{-2}$ where $a_1$ and $a_2$ are complex coefficients, for example. $X^{\sim}_{MP}(z)=a_2^*+a_1^*z^{-1}+z^{-2}$ where $a_1^*$ and $a_2^*$ are complex conjugates of complex coefficients $a_1$ and $a_2$. Generally, $X_{MP}(z)$ may be a transfer function of arbitrary length and the complex coefficients for $X^{\sim}_{MP}(z)$ may be found by reversing and conjugating the coefficients of $X_{MP}(z)$. Further, $X^+_{MP}(z)=X_{MP}(z)+X^{\sim}_{MP}(z)$ such that $X^+_{MP}(z)$ is an annihilating transfer function. In addition, $X^-_{MP}(z)=X_{MP}(z)-X^{\sim}_{MP}(z)$ such that $X^-_{MP}(z)$ is an annihilating transfer function. Thus, the minimum phase transfer function can be characterized as $X_{MP}(z)=X^+_{MP}(z)+X^-_{MP}(z)$.

The configuration of CFM 390 for a minimum phase filter module does not use nodes A, E, F, or G. $x_{MP}$ is mapped to two AH sequences $x_{MP}^{\pm}$ (LSF-MP-1 for simplicity) with LSFs as $\theta_{\pm}^{MP}$. Here $H_{B0}(z)=X^+_{MP}(z); H_{B1}(z)=X^-_{MP}(z); G_0=G_{MP}$; $H_{BC}(z)=X_{MP}(z); H_{BD}(z)=W(\mu_{MP}, \lambda_{MP}, z) X_{MP}(z)$.

An example may be summarized as:
$[x_{MP}:4]=\{1, 0.72759\angle(-0.02583), 0.90237\angle(-0.01154), 0.162\angle(-0.1)\}$;
$\rho_M[0]=0.2\angle(0.4); \rho_A[0]=0.9\angle(0.3)$.

The lattice structure for $X_{MP}(z)$ can be realized with one CFM block as follows. The Lattice structure for $x_{MP}^+$:
[$x_{MP}^+$: 5]={1, 0.84939∠(−0.00419), 1.8, 0.84939∠(0.00419), 1};
[u: 4]={−0.33994, −0.23189, 0.23766, 0.33417}; $L_V=0$;
[$k_U$:4]={1∠(0.16006), 1∠(0.26811), 1∠(−0.26234), 1∠(−0.16583)};
The Lattice structure for $x_{MP}^-$:
[$x_{MP}^-$: 5]={1, 0.62435∠(−0.05535), 0.13078∠(−0.25), 0.62435∠(−0.44465), 1∠(−0.5)};
[u: 4]={−0.29764, 0.01715, 0.29712, 0.48337}; $L_V=0$;
[$k_U$:4]={1∠(0.20236), 1∠(−0.48285), 1∠(−0.20288), 1∠(−0.01663)}
$G_0=G_{MP}=0$; $N_U=8$; $N_V=0$; where $N_U$, $N_V$ denote the number of lattice blocks of type $L_U$ and $L_V$ used in a CFM block.

The example filter module implemented on a CFM may be a non-minimum phase filter component, which has a non-minimum phase transfer function $X_{NP}(z)=1+b_1z^{-1}+b_2z^{-2}$ where $b_1$ and $b_2$ are complex coefficients, for example. Further, $X^{\sim}_{NP}(z)=b_2^*+b_1^*z^{-1}+z^{-2}=b_2^*[1+(b_1^*/b_2^*)z^{-1}+z^{-2}]$ where $b_1^*$ and $b_2^*$ are complex conjugates of complex coefficients $b_1$ and $b_2$. Generally, $X_{NP}(z)$ may be a transfer function of arbitrary length and the coefficients of $X^{\sim}_{NP}(z)$ may be found by reversing and conjugating the coefficients of $X_{NP}(z)$ and factoring $X^{\sim}_{NP}(z)$ such that $X^{\sim}_{NP}(z)=s^*[L]A_{MP}(z)$. Further, $s^*[L]$ may be a sequence of complex coefficients and $A_{MP}(z)$ is a minimum phase transfer function. Thus, $A_{MP}(z)$ can be characterized as $A_{MP}(z)=A^+_{MP}(z)+A^-_{MP}(z)$ where $A^+_{MP}(z)$ and $A^-_{MP}(z)$ are annihilating subcomponents of $A_{MP}(z)$.

The configuration of CFM 390 for a non-minimum phase filter module does not use nodes A or C. The function $a_{MP}$ is mapped to two AH sequences $a_{MP}^±$ (LSF-NP-1 for simplicity) with LSFs as $\theta_±^{NP}$. Here, $H_{B0}(z)=A^+_{MP}(z)$; $H_{B1}(z)=A^-_{MP}(z)$; $G_0=G_{MP}$; $G_1=K_{NP}$; $H_{BG}(z)=W(\mu_{MP}, \lambda_{MP}+D_1, z)X_{NP}(z)$; D0=∞, i.e., node D connects directly to node E, or addition is bypassed.

An example may be summarized as follows:
[$x_{NP}$:4]={1, 1.4588∠(0.25547), 2.2312∠(−0.18898), 5.55556∠(0.13)};
$\rho_N[0]=2∠(−0.37)$; $\rho_B[0]=0.6∠(0.18)$;

The lattice structure for $X_{NP}(z)$ can be realized with one CFM block as follows:
The Lattice structure for $a_{MP}^+$
[$a_{MP}^+$:5]={1, 0.23766∠(0.28062), 0.37024, 0.23766∠(−0.28062), 1};
[u: 4]={−0.34178, −0.15354, 0.12411, 0.37121}; $L_V=0$;
[$k_U$:4]={1∠(0.15822), 1∠(0.34646), 1∠(−0.37589), 1∠(−0.12879)};
The Lattice structure for $a_{MP}^-$
[$a_{MP}^-$:5]={1, 0.57525∠(0.3347), 0.37246∠(−0.25), 0.57525∠(0.1653), 1∠(−0.5)};
[u: 4]={−0.45157, −0.23885, −0.02879, 0.21921}; $L_V=0$;
[$k_U$:4]={1∠(0.04843), 1∠(0.26115), 1∠(0.47121), 1∠(−0.28079)};
$G_0=G_{MP}=0$; $G_1=K_{NP}=5.55556∠(0.13)$; $N_U=8$; $N_V=0$; where $N_U$, $N_V$ denote the number of lattice blocks of type $L_U$ and $L_V$ used in a CFM block.

The example digital filter implemented on a CFM may be a symmetric filter component. Further, the symmetric filter component 800 may have a symmetric transfer function $X_{SM}(z)=c_0+c_1z^{-1}+c_2z^{-2}+c_1z^{-3}+c_0z^{-4}$ where $c_0, c_1, c_2$ are complex coefficients, for example. Further, $$X_{SM}(z)=(c_0/2)[2d_0+2d_1z^{-1}+2z^{-2}+2d_1z^{-3}+2d_0z^{-4}]$$

$$X_{SM}(z)=(c_0/2)[\{2d_0+2d_1z^{-1}+z^{-2}\}+z^{-2}\{1+2d_1z^{-1}+2d_0z^{-2}\}]$$

$$X_{SM}(z)=(c_0/2)[A^-_{MP}(z)+z^{-2}A_{MP}(z)]$$

where $A_{MP}(z)$ is a minimum phase filter component. Generally, $X_{SM}(z)$ may be a transfer function of arbitrary length. The configuration of CFM 390 for a symmetric filter module does not use node A. The function $a_{MP}$ is mapped to two AH sequences $a_{MP}^±$ (LSF-SM-1 for simplicity) with LSFs as $\theta_±^{SM}$. Here, $H_{B0}(z)=A^+_{MP}(z)$; $H_{B1}(z)=A^-_{MP}(z)$; $G_0=G_{MP}$; $G_1=K_{SM}$; $H_{BG}(z)=W(0_{MP}, \lambda_{MP}+D_1, z)X_{SM}(z)$; $D_0=L_{SM}+\lambda_{MP}$; D1≥1 is an additional delay.

An example may be summarized as follows:
[$X_{SM}$:7]={1, 1.2746∠(0.30285), 0.86793∠(0.10843), 2.96328∠(0.4), 0.86793∠(−0.30843), 1.2746∠(0.49715), 1∠(−0.2)};
$\rho_C[0]=0.8∠(−0.1)$; $\rho_D[0]=0.9∠(−0.3)$;
[$a_{MP}$:4]={1, 0.58579∠(0.29157), 0.86026∠(0.09715), 0.67493∠(0.4)}

The lattice structure for $X_{SM}(z)$ can be realized with one CFM block in as follows:
[$a_{MP}^+$:5]={1, 0.71752∠(0.46211), 1.40985, 0.71752∠(−0.46211), 1};
[u: 4]={−0.27113, −0.1671, 0.13415, 0.304081; $L_V=0$;
[$k_U$:4]={1∠(0.22887), 1∠(0.3329), 1∠(−0.36585),
[$a_{MP}^-$:5]={1, 1.04044∠(0.18806), 0.98617∠(0.25), 1.04044∠(0.31194), 1∠(−0.5)};
[u: 4]={−0.45443, −0.23446, −0.11011, 0.299}; $L_V=0$;
[$k_U$:4]={1∠(0.04557), 1∠(0.26554), 1∠(0.38989), 1∠(−0.201)
$G_0=G_{MP}=0$; $G_1=K_{SM}=1.48164∠(0.4)$; $N_U=8$; $N_V=0$; where $N_U$, $N_V$ denote the number of lattice blocks of type $L_U$ and $L_V$ used in a CFM block.

Figure 12A:
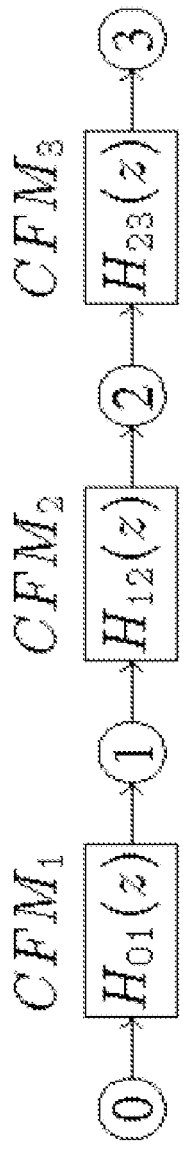
FIGS. 12A and 12B depict canonic filter module configurations, all arranged in accordance with at least some embodiments described herein.

Following, in Table C, is a summary of LSF-A and LSF-B (FIG. 7/[1]) that have the same LSF set $\chi^x$. The transfer function X(z) can be realized by cascading three independent CFM blocks as shown in FIG. 12A and as summarized below in Table C:

TABLE C

Principle: (Table-II/[1] and FIG. 7/[1] for LSF-A/LSF-B)

As X(z) = $X_{LP}(z)X_{MP}(z)X_{NP}(z)$ from the LSF-Model $X^x$ in Table-III/[1], X(z) can be realized with three CFM blocks, C F $M_1$, C F $M_2$ and C F $M_3$ as follows.
(a) C F $M_1$ in $C_{LP}$: $H_{01}(z) = \Omega(0, \lambda_{VEC}[0], z)X_{LP}(z)$;
(b) C F $M_2$ in $C_{MP}$: $H_{12}(z) = X_{MP}(z)$;
(c) C F $M_3$ in $C_{NP}$: $H_{23}(z) = \Omega(\mu_{VEC}[1], \lambda_{VEC}[2], z)X_{NP}(z)$;
The above configuration ((a) to (c)) effectively gives,
$H_{03}(z) = \Omega(\mu_{VEC}[1], \lambda_{VEC}[0] + \lambda_{VEC}[2], z)X(z)$;
The Example-10 illustrates this FIR lattice structure.

Figure 12B:
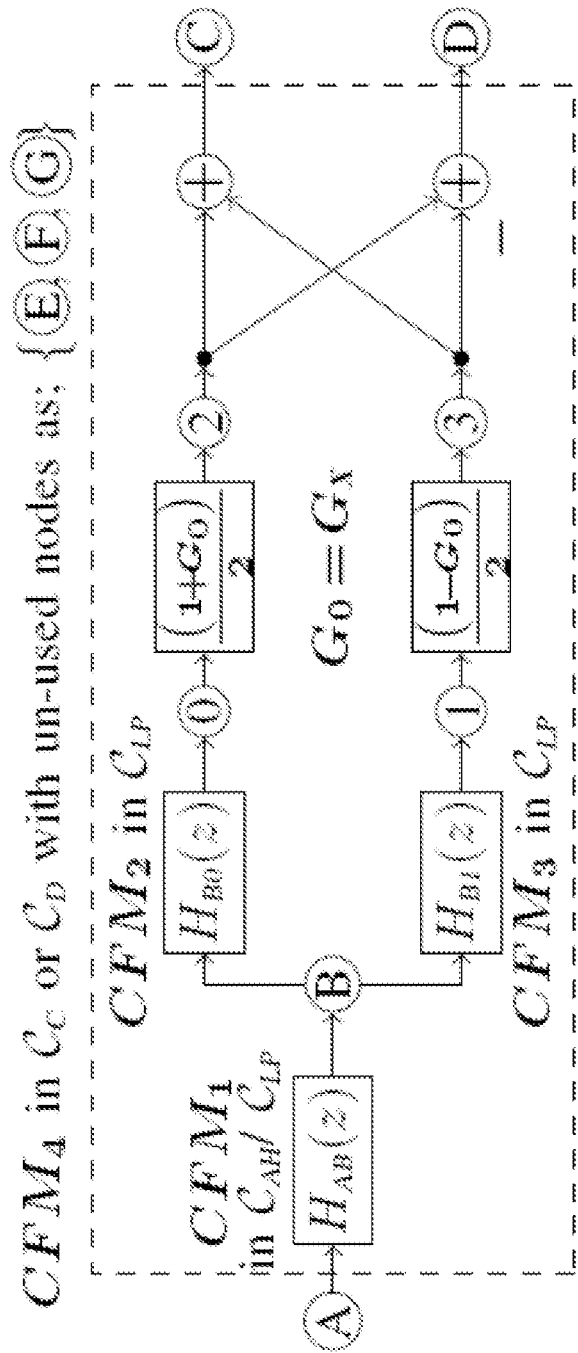

As shown in FIG. 12B, and as summarized below in Table D, two configurations $C_C$ and $C_D$ which are based on $\chi^x$ in LSF-C and LSF-D (FIG. 8/[1]) to realize $\{\chi, \chi^W\}$ [1]. Note that table D refers to further details set forth in Tables 1-3, below.

TABLE D

Principle: (Property-15/[1] and FIG. 8/[1] for LSF-C/LSF-D)

Here X(z) = $X_1(z)X_2(z)$ and the LSF-Model of $\chi_1$ in Table-III[1] is used to configure
C F $M_4$ block which internally uses three CFM blocks (FIG. 3B, and Table B), C F $M_1$, C F $M_2$ and
C F $M_3$ given as follows.
(a) The C F $M_1$ block realizes $H_{AB}(z) = X_2(z)$;
(b) The C F $M_2$ block realizes $H_{B0}(z) = z^{-DPQ}X_1^+(z)$;
(c) The C F $M_3$ block realizes $H_{B1}(z) = z^{-DPQ}X_1^-(z)$;

$X_1^±(z)$ are obtained with model parameters $\mu_1 \triangleq \mu_{VEC}[0]$ and $\lambda_1 \triangleq \lambda_{VEC}[1]$ (Table-III/[1]). The Table-I and Table-II summarize the configuration of C F $M_2$ and C F $M_3$ blocks.

TABLE D-continued

Principle: (Property-15/[1] and FIG. 8/[1] for LSF-C/LSF-D)

$C_c$: Configuration of C F $M_4$ with $\chi^x$ in LSF-C (in FIG. 8/[1])
Here $X_1(z) = X_{NA}(z)$ and $X_2(z) = X_{AH}(z)$;
(4.1) C F $M_1$ in $C_{AH}$: $H_{AB}(z) = X_{AH}(z)$;
(4.2) C F $M_2$ in $C_{LP}$: $H_{B0}(z) = z^{-DPQ}X_{NA}^+(z)$; (Table-I)
(4.3) C F $M_3$ in $C_{LP}$: $H_{B1}(z) = z^{-DPQ}X_{NA}^-(z)$; (Table-II)
The above configuration ((4.1) to (4.3)) effectively gives, $H_{AC}(z) = \Omega(0, D_{PQ}, z)X(z)$ $H_{AD}(z) = \Omega(\mu_1 - \alpha_{AH}, \lambda_1 + D_{PQ}, z)X(z)$
The Example-11 to Example-14 illustrate this FIR structure.

$C_D$: Configuration of C F $M_4$ with $X^x$ in LSF-D (in FIG. 8/[1])
Here $X_1(z) = X_{NLP}(z)$ and $X_2(z) = X_{LP}(z)$ ;
(4.1) C F $M_1$ in $C_{LP}$: $H_{AB}(z) = \Omega(0, \lambda_{MP}^E, z)X_{LP}(z)$ with $\lambda_{MP}^E \lambda_{VEC}[0]$
(Table-III/[1]). The Table-III summarizes this configuration.
(4.2) C F $M_2$ in $C_{LP}$: $H_{B0}(z) = z^{-DPQ}X_{NLP}^+(z)$; (Table-I)
(4.3) C F $M_3$ in $C_{LP}$: $H_{B1}(z) = z^{-DPQ}X_{NLP}^-(z)$; (Table-II)
The above configuration ((4.1) to (4.3)) effectively gives, $H_{AC}(z) = \Omega(0, D_{PQ} + \lambda_{MP}^E, z)X(z)$ $H_{AD}(z) = \Omega(\mu_1 - \alpha_{LP}, \lambda_1 + D_{PQ} + \lambda_{MP}^E, z)X(z)$
The Example-15 to Example-18 illustrate this FIR structure.

TABLE I

Configuration of C F $M_2$ Block

This CFM block is configured in $C_{LP}$ (FIG. 3B) to realize the linear-phase transfer function $z^{-DPQ}X_1^+(z)$
From Property-15/[1], $X_1^+(z)$ has an A-H factor $X_P^{AH}(z)$ and $X_P^{SM}(z)$.
From FIG. 6/[1]. $\alpha_{MP}$ (of $X_P^{SM}$ Theorem-1/[1]) is mapped to two AH-sequences $\alpha_{MP}^+$ (LSF-SM-1 for simplicity) with LSFs as $[\theta_\pm^P: L_P]$.
(2.1) $H_{AB}(z) = X_P^{AH}(z)$; (2.2) $H_{B0}(z) = A_{MP}^+(z)$; (2.3) $H_{B1}(z) = A_{MP}^-(z)$;
(2.4) $G_0 = G_P^{SM}$; (2.5) $D_0 = L_P$; (2.6) $D_1 = D_P$; (2.7) $G_1 = K_P^{SM}$.
The above configuration ((2.1) to (2.7)) effectively gives,
$H_{BG}(z) = z^{-DPQ}X_P^{SM}(z)$ and $H_{AG}(z) = z^{-DPQ}X_1^+(z)$.

TABLE II

Configuration of C F M3 Block

This CFM block is configured in $C_{LP}$ to realize the linear-phase transfer function $z^{-DPQ}X_1^-(z)$
From Property-15/[1], $X_1^-(z)$ has an AH-factor $X_Q^{AH}(z)$ and $X_Q^{SM}(z)$.
From FIG. 6/[1], $\alpha_{MP}$ (of $X_Q^{SM}$ Theorem-1/[1]) is mapped to two AH-sequences $\alpha_{MP}^\pm$ (LSF-SM-1 for simplicity) with LSFs as $[\theta_\pm^Q: L_Q]$.
(3.1) $H_{AB}(z) = X_Q^{AH}(z)$; (3.2) $H_{B0}(z) = A_{MP}^+(z)$; (3.3) $H_{B1}(z) = A_{MP}^-(z)$;
(3.4) $G_0 = G_Q^{SM}$; (3.5) $D_0 = L_Q$; (3.6) $D_1 = D_Q$; (3.7) $G_1 = K_Q^{SM}$.
The above configuration ((3.1) to (3.7)) effectively gives
$H_{BG}(z) = z^{-DPQ}X_Q^{SM}(z)$ and $H_{AG}(z) = z^{-DPQ}X_1^-(z)$.

TABLE III

Configuration of C F $M_1$ Block in $C_D$

This CFM Block is configured in $C_{LP}$ (FIG. 3B, and Table B) to realize the linear-phase transfer function $\Omega(0, \lambda_{MP}^E, z)X_{LP}(z)$
From Table-II/[1], $X_{LP}(z)$ has an AH-factor $X_{AH}(z)$ and $X_{SM}(z)$. From FIG. 6/[1], $\alpha_{MP}$ (of $X_{SM}$ Theorem-1/[1]) is mapped to two AH-sequences $\alpha_{MP}^\pm$ (LSF-SM-1 for simplicity) with LSFs as $[\theta_\pm^{SM}: L_{SM}]$.
(1.1) $H_{AB}(z) = X_{AH}(z)$; (1.2) $H_{B0}(z) = A_{MP}^+(z)$; (1.3) $H_{B1}(z) = A_{MP}^-(z)$;
(1.4) $G_0 = G_{SM}$; (1.5) $D_0 = (L_{SM} + \lambda_{MP}^E)$; (1.6) $D_1 = 0$; (1.7) $G_1 = K_{SM}$.
The above configuration ((1.1) to (1.7)) effectively gives,
$H_{BG}(z) = \Omega(0, \lambda_{MP}^E, z)X_{SM}(z)$ and $H_{AG}(z) = \Omega(0, \lambda_{MP}^E, z)X_{LP}(z)$.

FIG. 4 is a functional block diagram of an example half-lattice notch filter 400 arranged in accordance with at least some embodiments of the present disclosure. Note that it is a single port device in that it has a single input node and a single output node. The half-lattice notch filter 400 has a transfer function $X_U(z)=(1-e^{j2\pi\alpha}z^{-1})$. A notch filter has a frequency response such that the notch filer suppresses or reduces a frequency component or a small range of frequencies. The half-lattice notch filter 400 suppresses or reduces the frequency component corresponding to $\alpha$. The transfer function $X_U(z)$ for the notch filter 400 can be realized with a half-lattice structure shown in FIG. 4. The half-lattice notch filter 400 can be implemented using a delay circuit 410, a multiplier circuit 420, and an adder circuit 430. The delay circuit 410 is configured to receive an input signal from an input node and configured to delay the input signal for one time interval. Further, as mentioned previously, the half-lattice notch filter may be realized in a digital signal processor, ASIC, FPGA, or any other specialized processor having memory. The multiplier circuit 420 may access a half-lattice coefficient from such a memory and multiply the half-lattice coefficient to the signal from the delay circuit 410. A value for the half-lattice coefficient may be $k_U=e^{j2\pi\alpha}$. The resulting signal can be provided to adder circuit 430 which adds the signal from the multiplier circuit to the input signal received from the input node. The resulting signal from the adder circuit 430 can be provided to an output node of the half-lattice notch filter 400.

FIG. 5 is a functional block diagram of an example full-lattice notch filter 500 arranged in accordance with at least some embodiments described herein. Note that it is a single port device in that it has a single input node and a single output node. The full-lattice notch filter 500 has a transfer function $X_V(z)=X_U(z)X_U(z)=(1-2\cos(2\pi\alpha)z^{-1}+z^{-2})$. The full-lattice notch filter 500 is configured to suppress or reduce the frequency component corresponding to $\alpha$. The transfer function $X_V(z)$ for the notch filter 500 can be realized with a full-lattice structure shown in FIG. 5. The full-lattice notch filter 500 can be implemented using two delay circuits (510, 560), two multiplier circuits (520, 540), and three adder circuits (530, 550, 570).

The delay circuit 510 is configured to receive an input signal from an input node and to delay the input signal for one time interval. Further, as mentioned previously, the full-lattice notch filter may be realized in a digital signal processor ASIC, FPGA, or any other specialized processor having memory. The multiplier circuit 520 may be configured to access a full-lattice coefficient $k_V=-\cos(2\pi\alpha)$ from such a memory and to multiply the full-lattice coefficient by the signal from the delay circuit 510. The resulting signal can be provided to adder circuit 530 which can be configured to add the signal from the multiplier circuit to the input signal received from the input node. Further, multiplier circuit 540 can be configured to receive the input signal from the input node, accesses the full-lattice coefficient $k_V$ from memory, and multiply $k_V$ by the input signal. The resulting signal can be coupled to adder circuit 550 which can be configured to add the signal from the multiplier circuit to the delayed input signal received from delay circuit 510. The resulting signal from adder circuit 550 can be coupled to delay circuit 560. The resulting delayed signal from delay circuit 560 can be coupled to adder circuit 570. The adder circuit 570 can be configured to add the signal received from adder circuit 530 to the signal received from delay circuit 560 and to couple the resulting signal to an output node. The resulting signal from adder circuit 570 is the output signal for the full-lattice notch filter shown in FIG. 5.

FIG. 6 is a functional block diagram 600 of an annihilating filter component 610 that is similar to the annihilating filter component 320 shown in FIG. 3A arranged in accordance with at least some embodiments described herein. The transfer function of the annihilating filter component may be $X_{AH}$ (z) and may be referred to an annihilating transfer function. The impulse response for such a transfer function may be referred to an annihilating sequence $x_{AH}[n]$. The example digital filter 610 may be implemented by cascading a digital filter 620 having a transfer function, $X_U(z)$, and a digital filter 630 having a transfer function $X_V(z)$. The digital filter 620 with transfer function $X_U(z)$ may be a combination of the half-lattice notch filters as shown in FIG. 4 while the digital filter 630 with transfer function $X_V(z)$ may be a combination of full-lattice notch filters as shown in FIG. 5.

An annihilating transfer function has roots on the unit circle in the z-domain. Thus, an annihilating sequence or annihilating transfer function may be characterized by $[\theta_{AH}, L_{AH}]$ where $L_{AH}$ is the number of roots for the annihilating transfer function and $\theta_{AH}$ is the roots of the annihilating transfer function such that the root is given by $e^{j2\pi\theta_{AH}[1]}$ which implies $X_{AH}(f)=0$ for $f=\theta_{AH}[1]$.

For example, an annihilating sequence, $x_{AH1}[n]$ may be given as $[\theta_{AH}, 6]=\{0.07, 0.18, 0.2, -0.2, 0.36, -0.36]$. The annihilating transfer function $X_{AH1}(z)$ that corresponds to the annihilating sequence $x_{AH1}[n]$ has six roots that includes two single roots (0.07 and 0.18) and two conjugate pairs (0.2, −0.2, 0.36, and −0.36). Each single root (0.07 and 0.18) can be characterized as transfer function for a half-lattice notch filter. Further, each conjugate pair may be characterized as transfer function for full-lattice notch filter. The two half-lattice notch filters may be cascaded together to form a digital filter 620 with transfer function $X_U(z)=(z-e^{j2\pi(0.07)})(z-e^{j2\pi(0.18)})$ where the transfer function for one half-lattice notch filter is $(z-e^{j2\pi(0.07)})$ and the transfer function for the other half-lattice notch filter is $(z-e^{j2\pi(0.18)})$. One half-lattice notch filter is configured to suppress or reduce the frequency component at f=0.07 and the other half-lattice notch filter is configured to suppress or reduce the frequency component at f=0.18. The half-lattice coefficients may be calculated as $K_{U1}=-e^{j2\pi(0.07)}=1<(-0.43)$ and $K_{U2}=-e^{j2\pi(0.18)}=1<(-0.32)$.

Alternatively, the two full-lattice notch filters may be cascaded together to form a digital filter 630 with transfer function $X_V(z)=(z-e^{j2\pi(0.2)})(z-e^{j2\pi(-0.2)})(z-e^{j2\pi(0.36)})(z-e^{j2\pi(-0.36)})$ where one transfer function for one full-lattice transfer function is $(z-e^{j2\pi(0.2)})(z-e^{j2\pi(-0.2)})$ and the transfer function for the other full-lattice transfer function is $(z-e^{j2\pi(0.36)})(z-e^{j2\pi(-0.36)})$. One full-lattice notch filter is configured to suppress or reduce frequency components at f=−0.2 and f=0.2 and the other full-lattice notch filter is configured to suppress or reduce frequency components at f=−0.36 and f=0.36. The full-lattice coefficients may be calculated as $K_{V1}=-\cos(2\pi(0.2))=-0.30902$ and $K_{V2}=-\cos(2\pi(0.36))=0.63742$.

Figure 7:
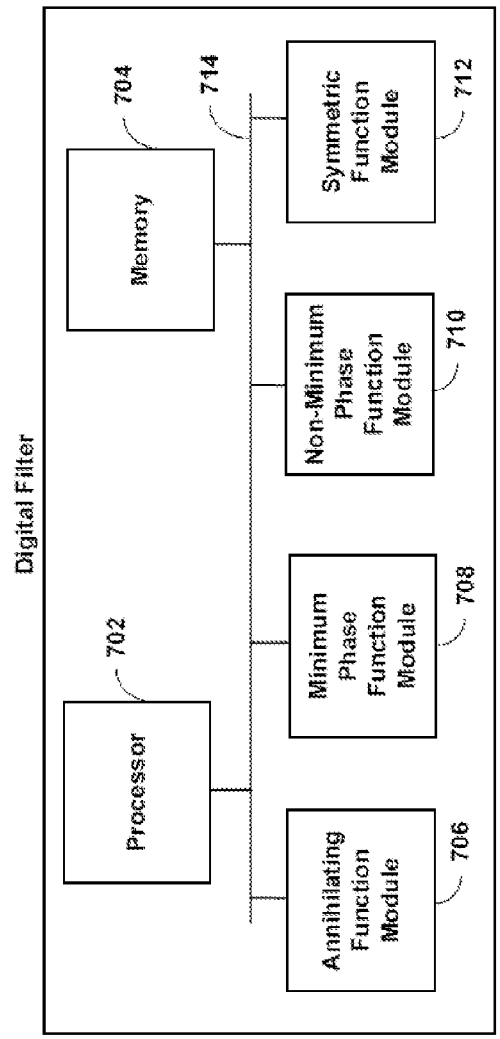
FIG. 7 is an example hardware implementation of a digital filter.

FIG. 7 is a functional block diagram of a digital filter 700 arranged in accordance with at least some embodiments described herein. A digital signal processor (DSP), ASIC, FPGA, or any other specialized processor may be used to implement the digital filter 700. The digital filter may include several components including a microprocessor 702 that may be a computing device that is configured to control the operations of the digital filter 700. Further, the digital filter may include four function modules including an annihilating function module 706, a minimum phase function module 708, a non-minimum phase function module 710, and a symmetric function module 712. In one embodiment, the depicted function modules are each implemented in software instructions that are stored in program memory and executed on the processor. In this embodiment, each of the modules are instructions stored in memory, which may be the same as memory 704. Each function module may comprise a set of interconnected notch filters. One set of notch filters may be half-lattice notch filters and another set of notch filters may be full-lattice notch filters. Further, the digital filter 700 may be configured to use memory 704 that is coupled to the processor 702 and configured to store CFM configuration data which includes sets of half-lattice and full-lattice coefficients corresponding respectively to the half-lattice sets and full-lattice sets of interconnected notch filters.

In an alternative embodiment, the modules 706-712 may take the form of a logic circuit that may be realized as part of an FPGA. Each component may be designed separately, or they may all be combined within a single logic circuit. Still further, as described herein, each notch filter lattice structure that makes up the various components 706-712 may be programmable and reused during different portions of the overall filtering operation. The filter input/output sequences may be buffered to allow for reuse of the filter hardware components. This may be desirable when the overall sampling rate of the digital signal is some fraction of the internal processing rate of the filter 700. Thus, in this alternative embodiment, the microprocessor 702, memory 704 as well as the function modules (706, 708, 710, and 712) may be separate hardware modules coupled to each other by an internal bus 714. Other suitable interconnections may be used between the microprocessor, memory and the function modules to communicate with each other.

Figure 11:
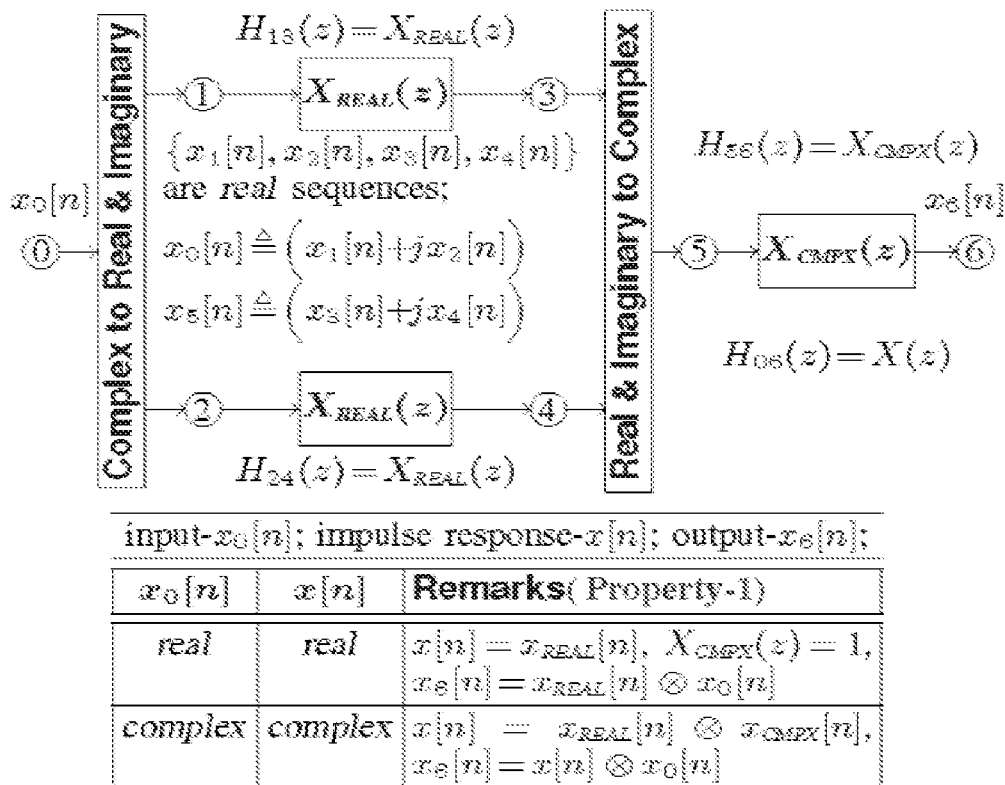
FIG. 11 depicts complex filtering structures.

The structures described herein may be used for FIR filtering of real and complex sequences. For stable filters, $h_{DEN}$ is an MP-sequence [2]. In most of the practical digital filters, the corresponding sequence $h_{34}$ also turns out to be an MP-sequence. In many practical systems, typically filtering is performed in one of the two cases (i) real input sequence with real impulse response (ii) complex input sequence with complex impulse response. In the former case, it is easy to see that the LSF-Model of a real sequence is required for the CFM based lattice structure. Further, the Multiplication operation may not be required (Table-IV, below) in the lattice block $L_U$ and $L_V$ whenever $\alpha \in \{-(\frac{1}{2}), 0\}$. This motivates us to bifurcate a sequence x into two sequences $X_{REAL}$ and $X_{CMPX}$ as in the following Property-1. From Property-1, an FIR filter with impulse response x can be realized as a cascade of two FIR filters with impulse responses as $X_{REAL}$ and $X_{CMPX}$ as in FIG. 11. An LSF-Model of $X_{REAL}$ can be obtained by setting the $\mu_{VEC}$ to zeros so that the spectral polynomials are always real. These two FIR filters can be realized independently with CFM blocks.

TABLE 4

Arithmetic Complexity of Lattice Stages

| Block | Reflection Coefficient | Input-$x_0[n]$ | Add | Mul | Rot |
|---|---|---|---|---|---|
| $\Lambda_A$ | $\kappa$(complex) | complex | 8 | 8 | 0 |
| $\Lambda_A$ | $\kappa$(real) | real | 2 | 2 | 0 |
| $\Lambda_U$ | $\kappa_U$(phasor), $\alpha \neq 0$ or $\alpha \neq -\left(\frac{1}{2}\right)$ | complex | 2 | 0 | 1 |
| $\Lambda_U$ | $\kappa_U$(phasor), $\alpha = 0$ or $\alpha = -\left(\frac{1}{2}\right)$ | real | 1 | 0 | 0 |
| $\Lambda_V$ | $\kappa_V$(real), $\alpha \neq 0$ or $\alpha \neq -\left(\frac{1}{2}\right)$ | real | 2 | 1 | 0 |
| $\Lambda_V$ | $\kappa_V = \pm 1$, $\alpha = 0$ or $\alpha = -\left(\frac{1}{2}\right)$ | real | 4 | 0 | 0 |

Regarding the arithmetic complexity of the CFM, the notch filter $L_U$ in FIG. 4 can be implemented with a Rotate-And-Accumulate (RAC) operation and the notch filter $L_V$ can be implemented with a real Multiply-And-Accumulate (MAC)

operation. The rotation part of RAC may be realized with CORDIC algorithms (see reference [7] and [8]). Arithmetic complexity of a complex multiplication as four real multiplications (Mul) and two real additions (Add) and the operation of $e^{j2\pi\theta}w$ as a complex rotation operation (Rot) of w, the arithmetic complexity of lattice stages is summarized in Table IV.

In some of the signal processing applications, it may be necessary to shape the spectrum of a sequence, with a spectral function which is the auto-correlation of a reference sequence. In communication systems, the Raised-Cosine or Root-Raised-Cosine spectral functions are typically used to minimize Inter-Symbol-Interference (ISI) at a marginal increase in the bandwidth. If $[x:L_x+1)]$ is a reference sequence with desired spectrum, then this spectral shaping requires an FIR filter with LP-impulse response as $x^\dagger$ (Property-2/[1]). From the root structure of x (Table-II/[1]), we obtain two alternate spectral decompositions of $x^\dagger$ as summarized in Property-2. The Table E gives the canonic FIR lattice structure based on Property-2.

TABLE E

For a sequence $[x: (L_x + 1)]$, $|H_{04}(f)| = |X(f)|^2$ and
$\angle H_{04}(f) = \text{npmod}(-L_x f)$ (Property-2/[1]).
Principle: From Property-2, an FIR filter with transfer function
$H_{04}(z) = X^\dagger(z)$ and $x_4[n] = x^\dagger[n] \circledast x_0[n]$ can be realized as follows.

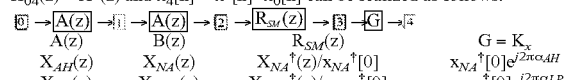

| | A(z) | B(z) | $R_{SM}(z)$ | G = $K_x$ |
| --- | --- | --- | --- | --- |
| | $X_{AH}(z)$ | $X_{NA}(z)$ | $X_{NA}^\dagger(z)/x_{NA}^\dagger[0]$ | $x_{NA}^\dagger[0]e^{j2\pi\alpha_{AH}}$ |
| | $X_{LP}(z)$ | $X_{NLP}(z)$ | $X_{NLP}^\dagger(z)/x_{NLP}^\dagger[0]$ | $x_{NLP}^\dagger[0]e^{j2\pi\alpha_{LP}}$ |

As $A(z) \in \{X_{AH}(z), X_{LP}(z)\}$, A(z) requires one CFM block in $C_{AH}$ or $C_{LP}$ configuration (FIG. 3B, and Table B).
$R_{SM}(z)$ requires one CFM block in $C_{SM}$ configuration (FIG. 3B, and Table B).
$A(z) = X_{AH}(z)$: $H_{01}(z)$ requires one CFM block and $H_{13}(z)$ requires another CFM block. Hence $H_{04}(z)$ requires two CFM blocks.
$A(z) = X_{LP}(z)$: $H_{01}(z)$, $H_{12}(z)$ and $H_{23}(z)$ each require one CFM block. Hence $H_{04}(z)$ requires three CFM blocks.
The Example-20 to Example-22 illustrate this lattice structure.

Figure 8:
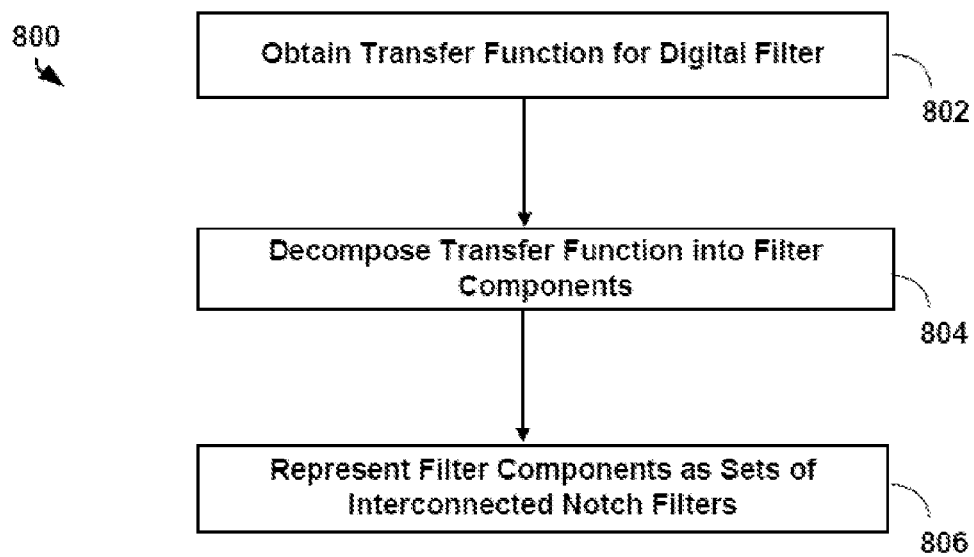
FIG. 8 is a flow chart for an example method for determining an example digital filter structure.

FIG. 8 is a flow chart 800 for an example method for determining an example digital filter structure, arranged in accordance with at least some examples described herein. The method may be implemented in the form of software instructions stored on a non-transitory, tangible, computer readable medium, for execution on a microprocessor. The method comprises obtaining a transfer function for a digital filter, as shown in block 802. The transfer function may be provided by reading a data structure in memory, or by otherwise receiving data from another software component such as a filter design program or via a user interface. The transfer function may be provided in terms of z-transform coefficients, or it may be derived from other components such as a desired finite impulse response. Once obtained, the transfer function can be operated upon by a decomposition module in the form of a software module, which decomposes the transfer function into one or more filter components, as shown in block 804. The filter components may be an annihilating component, a minimum phase component, a non-minimum phase component, and a symmetric component. The decomposition module may incorporate a root-finding utility, or may call available software library utilities to perform root finding. The described method may include representing each filter component as a set of interconnected notch filters, as shown in block 806. As described above, each set of notch filters may include at least one half-lattice notch filter and/or at least one full-lattice notch filter.

In order to decompose the filter components into the notch filter structures as described herein, each filter component can be further decomposed. Specifically, the annihilating component can be decomposed into a series combination of one or more half-lattice notch filters and one or more full-lattice notch filters. The decomposition module implements the coefficient manipulation described above to decompose the minimum phase component, the non-minimum phase component, and the symmetric component into annihilating subcomponents, and then represents them as a series and parallel combination of one or more half-lattice notch filters and one or more full-lattice notch filters.

In embodiments of the methods described herein, a canonic filter module structure can be used to implement a filter component such as an annihilating component, a minimum phase component, a non-minimum phase component, and a symmetric component. Such a canonic filter module may be implemented within a digital signal processor (DSP), ASIC, FPGA, or any other specialized processor. Lattice coefficients of the half-lattice notch filter and the full-lattice notch filter for each set of notch filters used in an annihilating component, a minimum phase component, a non-minimum phase component, and a symmetric component, and may be stored in a data structure defining the digital filter structure. Such a data structure may be implemented in hardware and software in a digital signal processor (DSP), ASIC, FPGA, or any other specialized processor. The data structure may set forth the values of each of the filter variables shown in FIG. 3B, including the roots of filter modules 1010, 1015, 1025, 1030, 1085, and gains for modules 1035, 1040, 1080 and delay values for 1065 and 1070.

Figure 9:
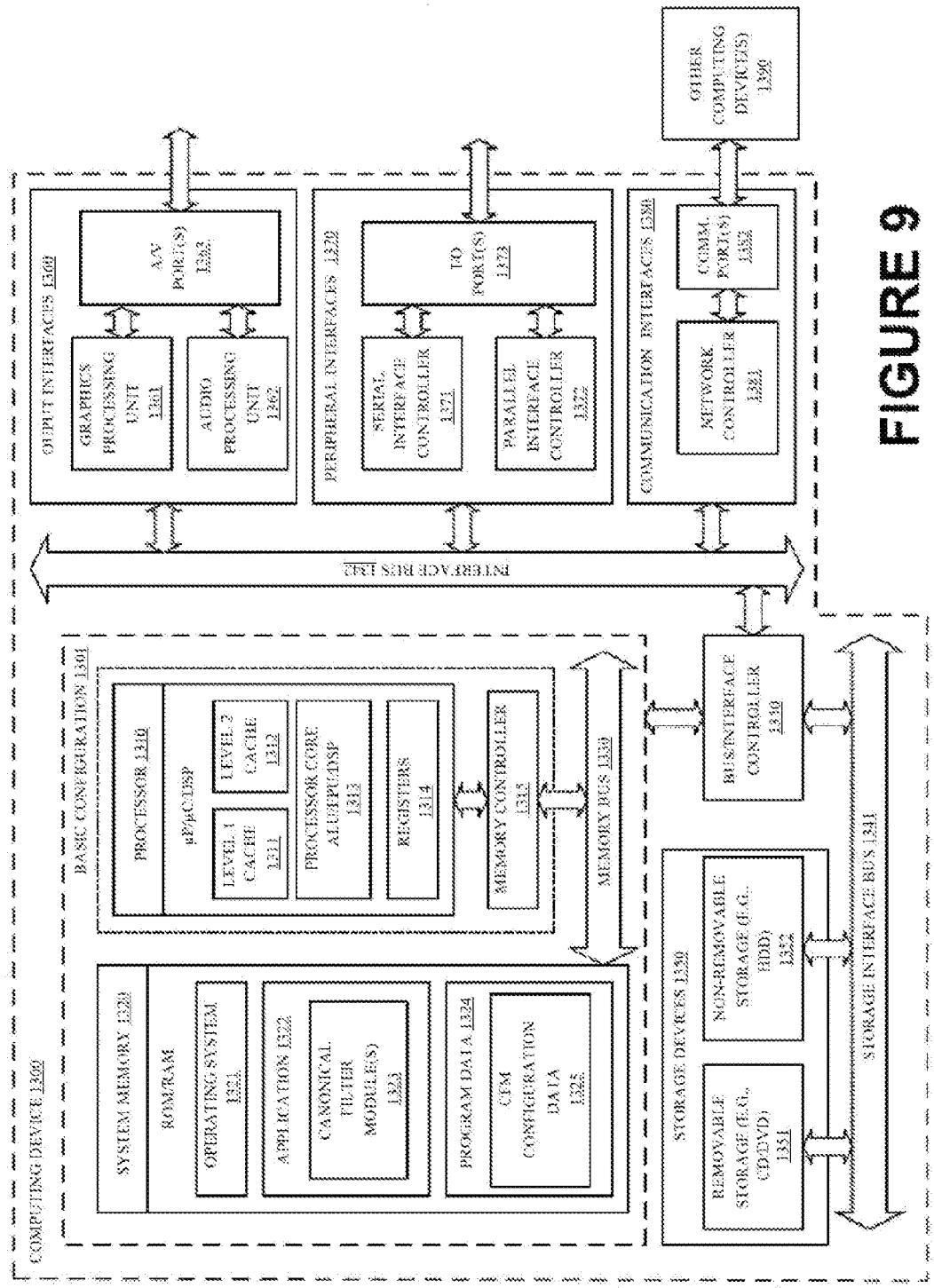
FIG. 9 a functional block diagram illustrating an example computing device used in a digital signal processing system.

FIG. 9 is a functional block diagram illustrating an example computing device 1300 used in a digital signal processing system, arranged in accordance with at least some examples described herein. In a very basic configuration 1301, computing device 1300 typically includes one or more processors 1310 and system memory 1320. A memory bus 1330 can be used for communicating between the processor 1310 and the system memory 1320. Depending on the desired configuration, processor 1310 can be of any type including but not limited to a microprocessor (µP), a microcontroller (µC), a digital signal processor (DSP), or any combination thereof. Processor 1310 can include one more levels of caching, such as a level one cache 1311 and a level two cache 1312, a processor core 1313, and registers 1314. The processor core 1313 can include an arithmetic logic unit (ALU), a floating point unit (FPU), a digital signal processing core (DSP Core), or any combination thereof. A memory controller 1315 can also be used with the processor 1310, or in some implementations the memory controller 1315 can be an internal part of the processor 1310.

Depending on the desired configuration, the system memory 1320 can be of any type including but not limited to volatile memory (such as RAM), non-volatile memory (such as ROM, flash memory, etc.) or any combination thereof. System memory 1320 typically includes an operating system 1321, one or more applications 1322, and program data 1324. Application 1322 includes one or more canonical filter module routines 1323. Program Data 1324 includes CFM configuration data 1325.

Computing device 1300 can have additional features or functionality, and additional interfaces to facilitate communications between the basic configuration 1301 and any required devices and interfaces. For example, a bus/interface controller 1340 can be used to facilitate communications between the basic configuration 1301 and one or more data storage devices 1350 via a storage interface bus 1341. The data storage devices 1350 can be removable storage devices 1351, non-removable storage devices 1352, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Exemplary computer storage media can include volatile and nonvolatile, removable and non-removable media implemented in any method or technology for storage of information, such as computer readable instructions, data structures, program modules, or other data.

System memory 1320, removable storage 1351 and non-removable storage 1352 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1300. Any such computer storage media can be part of device 1300.

Computing device 1300 can also include an interface bus 1342 for facilitating communication from various interface devices (e.g., output interfaces, peripheral interfaces, and communication interfaces) to the basic configuration 1301 via the bus/interface controller 1340. Exemplary output interfaces 1360 include a graphics processing unit 1361 and an audio processing unit 1362, which can be configured to communicate to various external devices such as a display or speakers via one or more A/V ports 1363. Exemplary peripheral interfaces 1370 include a serial interface controller 1371 or a parallel interface controller 1372, which can be configured to communicate with external devices such as input devices (e.g., keyboard, mouse, pen, voice input device, touch input device, etc.) or other peripheral devices (e.g., printer, scanner, etc.) via one or more I/O ports 1373. An exemplary communication interface 1380 includes a network controller 1381, which can be arranged to facilitate communications with one or more other computing devices 1390 over a network communication via one or more communication ports 1382. The Communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 1300 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1300 can also be implemented as a personal computer including both laptop computer and non-laptop computer configurations.

In general, it should be understood that the circuits described herein may be implemented in hardware using integrated circuit development technologies, or yet via some other methods, or the combination of hardware and software objects that could be ordered, parameterized, and connected in a software environment to implement different functions described herein. For example, the present application may be implemented using a general purpose or dedicated processor running a software application through volatile or non-volatile memory. Also, the hardware objects could communicate using electrical signals, with states of the signals representing different data.

It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

Properties and Further Examples of the Canonic Lattice Filter Structures Based on Notch Filters:

For a sequence $[x:(L_x+1)]$      Property-1 with factors as in Table-IV[1];

$X_U(z) = X_{U1}(z)X_{U2}(z); L_U = (L_{U1} + L_{U2});$ $X_{U1}(z)$ has LSFs $[u1:L_{U1}]$ with $u1[i] \in \{-\frac{1}{2}, 0\}.$ $X_{U2}(z)$ has LSFs $[u2:L_{U2}]$ with $u2[i] \neq \{-\frac{1}{2}, 0\}.$ $X_M(z) = X_{M1}(z)X_{M2}(z); L_M = (L_{M1} + L_{M2});$ -continued $X_{M1}(z)$ has roots $[\rho_{M1}:L_{M1}]$ with $\angle\rho_{M1}[i] \in \{-\frac{1}{2}, 0\}.$ $X_{M2}(z)$ has roots $[\rho_{M2}:L_{M2}]$ with $\angle\rho_{M2}[i] \neq \{-\frac{1}{2}, 0\}.$ $X_N(z) = X_{N1}(z)X_{N2}(z); L_N = (L_{N1} + L_{N2});$ $X_{N1}(z)$ has roots $[\rho_{N1}:L_{N1}]$ with $\angle\rho_{N1}[i] \in \{-\frac{1}{2}, 0\}.$ $X_{N2}(z)$ has roots $[\rho_{N2}:L_{N2}]$ with $\angle\rho_{N2}[i] \neq \{-\frac{1}{2}, 0\}.$ $X_C(z) = X_{C1}(z)X_{C2}(z); L_C = (L_{C1} + L_{C2});$ $X_{C1}(z)$ has roots $[\rho_{C1}:L_{C1}]$ with $\angle\rho_{C1}[i] \in \{-\frac{1}{2}, 0\}.$ $X_{C2}(z)$ has roots $[\rho_{C2}:L_{C2}]$ with $\angle\rho_{C2}[i] \neq \{-\frac{1}{2}, 0\}.$ $A_{REAL}(z) \stackrel{\Delta}{=} X_{U1}(z)X_{M1}(z)X_{N1}(z)X_{C1}(z);$ $B_{REAL}(z) \stackrel{\Delta}{=} X_V(z)X_A(z)X_B(z)X_D(z);$ $X_{REAL}(z) \stackrel{\Delta}{=} A_{REAL}(z)B_{REAL}(z);$ $X_{CMPX}(z) \stackrel{\Delta}{=} X_{U2}(z)X_{M2}(z)X_{N2}(z)X_{C2}(z);$ $X(z) = X_{REAL}(z)X_{CMPX}(z).$ Property-2

For a monic sequence $[x:(L_x+1)]$ (Table-II/[1]); $X(z)=A(z)B(z)$ with $A(z)$ and $B(z)$ as follows.

| A(z) | B(z) | $A^\dagger(z) = e^{j2\pi\alpha}A^2(z)$ | Remarks |
|---|---|---|---|
| $X_{AH}(z)$ | $X_{NA}(z)$ | $e^{j2\pi\alpha_{AH}}X_{AH}^2(z)$ | $x^*_{AH}[L_{AH}] = e^{j2\pi\alpha_{AH}}$ |
| $X_{LP}(z)$ | $X_{NLP}(z)$ | $e^{j2\pi\alpha_{LP}}X_{LP}^2(z)$ | $x^*_{LP}[L_{LP}] = e^{j2\pi\alpha_{LP}}$ |

$X^\dagger(z) = A^\dagger(z)B^\dagger(z) = e^{j2\pi\alpha}A^2(z)B^\dagger(z);$ $B^\dagger(z)=b^\dagger[0]R_{SM}(z)$ with $R_{SM}(z)$ a monic SM-polynomial with coefficients $r_{SM}$ as follows.

| B(z) | B†(z) | rSM |
|---|---|---|
| $X_{NA}(z)$ | $x_{NA}^\dagger[0]R_{SM}(z)$ | $[r_{SM}:(2L_{NA}+1)]$ |
| $X_{NLP}(z)$ | $x_{NLP}^\dagger[0]R_{SM}(z)$ | $[r_{SM}:(2L_{NLP}+1)]$ |

$X^\dagger(z)=K_x A^2(z)R_{SM}(z)$ with $K_x$ given as follows.

| A(z) | B(z) | $K_x$ |
|---|---|---|
| $X_{AH}(z)$ | $X_{NA}(z)$ | $x_{NA}^\dagger[0]e^{j2\pi\alpha_{AH}}$ |
| $X_{LP}(z)$ | $X_{NLP}(z)$ | $x_{NLP}^\dagger[0]e^{j2\pi\alpha_{LP}}$ |

$x_{NA}^\dagger[0]e^{j2\pi\alpha_{AH}} = x_{NLP}^\dagger[0]e^{j2\pi\alpha_{LP}}.$

EXAMPLES

Example-1

Consider an AH-sequence with LSFs as $[\theta_{AH}:6]=\{0.07, 0.18, 0.2, -0.2, 0.36, -0.36\}$. Here $[u:2]=\{0.07, 0.18\}$ and $[v:2]=\{0.2, 0.36\}$ and the corresponding AH-sequences are as follows.

$[x_{AH}:7]=\{1, \quad 1.49148\angle(-0.3246), \quad 0.36087\angle(0.05678), 1.35201\angle(-0.375),$
$0.36087\angle(0.19322), \quad 1.49148\angle(-0.4254), \quad 1\angle(0.25)\};$
$L_{AH}=6;$

[$x_U$:3]={1, 1.88176∠(−0.375), 1∠(0.25)}; $L_U$=2;
[$x_V$:5]={1, 0.65681, 1.2121, 0.65681, 1}; $L_V$=2;
The FIG. 10 gives the frequency response of the above-AH-factors.

Example-2

For the AH-sequences in Example-1;
[$k_U$:2]={1∠(−0.43), 1∠(−0.32)};
[$k_V$:2]={−0.30902, 0.63742};

Example-3

Consider the AH-sequence $x_{AH}$ of x used in Example-1/[1]. The lattice structure of $X_{AH}(z)$ can be realized with one CFM block in $C_{AH}$ (FIG. 3B, AND TABLE B).
The Lattice structure for $h_{AB}=x_{AH}$ with $C_{AH}$:
[$x_{AH}$:4]={1, 1.44475∠(−0.43953), 1.4447540.02953), 1∠(−0.41)}; u[0]=0.09; v[0]=0.21;
$k_U$[0]=1∠(−0.41); $k_V$[0]=−0.24869; $N_U$=1; $N_V$=1;

Example-4

Consider the MP-sequence $x_{MP}$ of x in Example-1/[1].
The MP-sequence $x_{MP}$(Table-II/[1]):
[$x_{MP}$:4]={1, 0.72759∠(−0.02583), 0.90237∠(−0.01154), 0.162∠(−0.1)};
$\rho_M$[0]=0.2∠(0.4); $\rho_A$[0]=0.9 ∠(0.3);
The LSF-Model of $x_{MP}$ (FIG. 4/[1]) is obtained for $\mu_{MP}$=0 and $\lambda_{MP}$=1 Example-1/[1]. The lattice structure for $X_{MP}(z)$ can be realized with one CFM block in $C_{MP}$ (FIG. 3B, and Table B) as follows.
The Lattice structure for $h_{B0}=x_{MP}^+$ in FIG. 3B, and Table B:
[$x_{MP}^+$:5]={1, 0.84939∠(−0.00419), 1.8, 0.84939∠(0.00419), 1};
[u:4]={−0.33994, −0.23189, 0.23766, 0.33417}; $L_V$=0; [$K_U$:4]={1∠(0.16006), 1∠(0.26811), 1∠(−0.26234), 1∠(−0.16583)};
The Lattice structure for $h_{B1}=x_{MP}^-$ in FIG. 3B, and Table B:
[$x_{MP}^-$:5]={1, 0.62435∠(−0.05535), 0.13078∠(−0.25), 0.62435∠(−0.44465), 1∠(−0.5)};
[u:4]={−0.29764, 0.01715, 0.29712, 0.48337}; $L_V$=0;
[$k_U$:4]={1∠(0.20236), 1∠(−0.48285), 1∠(−0.20288), 1∠(−0.01663)};
The Lattice structure of $x_{MP}$ as in FIG. 3B, and Table B:
$h_{B0}$ and $h_{B1}$ as above; $G_0=G_{MP}$=0; $N_U$=8; $N_V$=0

Example-5

Consider the NP-sequence $x_{NP}$ of x in Example-1/[1].
The NP-sequence $x_{NP}$(Table-II/[1]):
[$x_{NP}$:4]={1, 1.4588∠(0.25547), 2.2312∠(−0.18898), 5.55556∠(0.13)};
$\rho_N$[0]=2∠(−0.37); $\rho_B$[0]=0.6∠(0.18);
The LSF-Model of $\alpha_{MP}$ (FIG. 5/[1]) is obtained for $\mu_{MP}$=0 and $\lambda_{MP}$=1 Example-1/[1]. The lattice structure for $X_{NP}(z)$ can be realized with one CFM block in $C_{NP}$ (FIG. 3B, and Table B) as follows.
The Lattice structure for $h_{B0}=\alpha_{MP}^+$ in FIG. 3B, and Table B:
[$a_{MP}^+$:5]={1, 0.23766∠(0.28062), 0.37024, 0.23766∠(−0.28062), 1};
[u:4]={−0.34178, −0.15354, 0.12411, 0.37121}; $L_V$=0;
[$k_U$:4]={1∠(0.15822), 1∠(0.34646), 1∠(−0.37589), 1∠(−0.12879)};
The Lattice structure for $h_{B1}=\alpha_{MP}^-$ in FIG. 3B, and Table B:
[$a_{MP}^-$:5]={1, 0.57525∠(0.3347), 0.37246∠(−0.25), 0.57525∠(0.1653), 1∠(−0.5)};
[u:4]={−0.45157, −0.23885, −0.02879, 0.21921}; $L_V$=0;
[$k_U$:4]={1∠(0.04843), 1∠(0.26115), 1∠(0.47121), 1∠(−0.28079)};
The Lattice structure of $x_{NP}$ as in FIG. 3B, and Table B:
$h_{B0}$ and $h_{B1}$ as above; $N_U$=8; $N_V$=0;
$G_0=G_{MP}$=0; $G_1=K_{NP}$=5.55556∠(0.13);

Example-6

Consider the SM-sequence $x_{SM}$ of x in Example-1/[1]
The SM-sequence $x_{SM}$(Table-II/[1]), FIG. 5/[1]):
[$x_{SM}$:7]={1, 1.2746∠(0.30285), 0.86793∠(0.10843), 2.9632840.4), 0.86793∠(−0.30843), 1.2743, 1.2746∠(0.49715), 1∠(−0.2)};
$\rho_C$[0]=0.8∠(−0.1); $\rho_D$[0]=0.9∠(−0.3);
[$\alpha_{MP}$:4]={1, 0.58579∠(0.29157), 0.86026∠(0.09715), 0.67493∠(0.4)}; (Theorem-1/[1])
The LSF-Model of $\alpha_{MP}$(FIG. 3B, and Table B/[1]) is obtained for $\mu_{MP}$=0 and $\lambda_{MP}$=1 Example-1/[1]. The lattice structure for $X_{SM}(z)$ can be realized with one CFM block in $C_{SM}$ (FIG. 3B, and Table B) as follows.
The Lattice structure for $h_{B0}=\alpha_{MP}^+$ in FIG. 3B, and Table B:
[$\alpha_{MP}^+$:5]={1, 0.71752∠(0.46211), 1.40985, 0.71752∠(−0.46211), 1};
[u:4]={−0.27113, −0.1671, −0.13415, 0.30408}; $L_V$=0;
[$k_U$:4]={1∠(0.22887), 1∠(0.3329), 1∠(−0.36585), 1∠(−0.19592)};
The Lattice structure for $h_{B1}=\alpha_{MP}^-$ in FIG. 3B, and Table B:
[$\alpha_{MP}^-$:5]={1, 1.04044∠(0.18806), 0.98617∠(0.25), 1.04044∠(0.31194), 1∠(−0.5)};
[u:4]={−0.45443, −0.23446, −0.11011, 0.299}; $L_V$=0;
[$k_U$:4]={1∠(0.04557), 1∠(0.26554), 1∠(0.38989), 1∠(−0.201)};
The Lattice structure of $x_{SM}$ in FIG. 3B, and Table B:
$h_{B0}$ and $h_{B1}$ as above; $N_U$=8; $N_U$=8; $N_V$=0;
$G_0=G_{MP}$=0; $G_1=K_{SM}$=1.48164∠(0.4);

Example-7

Consider the LP-sequence $x_{LP}$ of x used in Example-1/[1]. The lattice structure for $X_{LP}(z)=X_{AH}(z)X_{SM}(z)$ can be realized with one CFM block as given in $C_{LP}$. This structure uses be $C_{AH}$ (Example-3) and $C_{SM}$ (Example-6).

Example-8

Consider the LP-sequence $h_{LP}$ (Table-V in Nguyen and Vaidyanathan [10]) presented in Example-1/[3].
Characteristics of $h_{LP}$ (Table-II/[1]):
$h_{LP}$[0]=$2^{-7}$(0.75841); $X_{LP}(z) \triangleq H_{LP}(z)/h_{LP}$[0];
[$x_{LP}$:23]={1, −2.64691, 0.76951, 6.08388, −3.76609, −7.16357, 6.91654, 10.75691, −14.69693, −10.90959, 52.85078, 96.05306, 52.85078, −10.90959, −14.69693, 10.75691, 6.91654, −7.16357, −3.76609, 6.08388, 0.76951, −2.64691, 1};
[$x_{AH}$:9]={1, 5.35888, 14.41278, 24.73732, 29.41694, 24.73732, 14.41278, 5.35888, 1};
[$x_{SM}$:15]={1, −8.00578, 29.25875, −60.06195, 65.02339, −2.97119, −105.63161, 164.2252, −105.63161, −2.97119, 65.02339, −60.06195, 29.25875, −8.00578, 1};
$L_{LP}$=22, $L_U$=0, $L_V$=4, $L_C$=1, $L_D$=3;
[v:4]={0.31328, 0.34636, 0.3914, 0.44797};
[$\rho_D$:3]={0.51497∠(0.11084), 0.54854∠(0.04904), 0.64943∠(0.18523)}; $\rho_C$[0]=−0.87938;
Characteristics of $x_{SM}$(Theorem-1/[1]):
[$\alpha_{MP}$:8]={1, −1.28642, −0.03618, 0.79188, −0.73146, 0.35632, −0.0975, 0.01218}; $K_{SM}$=82.1126;

The LSF-Model of $\alpha_{MP}$ with $\mu=0$, $\gamma=1$ (Property-16/[1]) is used to obtain the lattice structure of $h_{LP}$ as follows.
The Lattice structure for $h_{B0}=\alpha_{MP}^+$ in FIG. 3B, and Table B:
$[\alpha_{MP}^+:9]=\{1, -1.27425, -0.13368, 1.14821, -1.46292, 1.14821, -0.13368, -1.27425, 1\}$;
$[v:4]=\{0.00936, 0.12635, 0.026156, 0.47009\}$; $L_U=0$;
$[k_V:4]=\{-0.99827, -0.70109, 0.07259, 0.98966\}$;
The Lattice structure for $h_{B1}=\alpha_{MP}^-$ in FIG. 3B, and Table B:
$[\alpha_{MP}^-:9]=\{1, -1.2986, 0.06131, 0.43556, 0, -0.43556, -0.06131, 1.2986, -1\}$;
$[u:2]=\{-0.5, 0\}$; $[k_U:2]=\{1, 1\angle(-0.5)\}$;
$[v:3]=\{0.06409, 0.18992, 0.36038\}$;
$[k_V:3]=\{-0.92001, -0.36857, 0.63928\}$;
The Lattice structure for $h_{AB}=x_{AH}$ with $C_{AH}$:
$[k_V:4]=\{0.3872, 0.56911, 0.7761, 0.94703\}$;
The Lattice structure for $h_{LP}$ in FIG. 3B, and Table B:
$h_{AB}$, $h_{B0}$ and $h_{B1}$ as above; $N_U=2$; $N_V=11$;
$G_0=G_{MP}=0$; $G_1=K_{SM}h_{LP}[0]$;

Example-9

Consider the Hilbert Transformer defined by the following Matlab function (Chapter-15, page-223 [11]).
b=firmpm (30, [0.1 0.9], [1.0 1.0], 'Hilbert')
Consider a sequence $h_{LP}$ with coefficients as the Matlab output vector b.
Characteristics of $h_{LP}$(Table-II/[1]):
$h_{LP}[0]=-0.0042$; $X_{LP}(z) \triangleq H_{LP}(z)/h_{LP}[0]$:
$[x_{LP}:31]=\{1, 0, 2.21232, 0, 4.48938, 0, 8.19924, 0, 14.19369, 0, 24.55829, 0, 46.9134, 0, 150.47865, 0, 150.47865, 0, -46.9134, 0, -24.55829, 0, -14.19369, 0, -8.19924, 0, -4.48938, 0, -2.21232, 0, -1\}$;
$[x_{AH}:3]=\{1, 0, -1\}$;
$[x_{SM}:29]=\{1, 0, 3.21232, 0, 7.7017, 0, 15.90094, 0, 30.09463, 0, 54.65292, 0, 101.56632, 0, 252.04497, 0, 101.56632, 0, 54.65292, 0, 30.09463, 0, 15.90094, 0, 7.7017, 0, 3.21232, 0, 1\}$;
$L_{LP}=30$, $L_U=2$, $L_V=0$, $L_C=0$, $L_D=7$; $[u:2]=\{-0.5, 0\}$;
$[\rho_D:7]=\{0.66304\angle(0.25), 0.66579\angle(0.31248), 0.66579\angle(0.18752), 0.6772\angle(0.37422), 0.6772\angle(0.12578), 0.71537\angle(0.06508), 0.71537\angle(0.43492)\}$;
Characteristics of $x_{SM}$(Theorem-1/[1]):
$K_{SM}=126.02249$;
$[\alpha_{MP}:15]=\{1, 0, 0.80594, 0, 0.43368, 0, 0.2388, 0, 0.12618, 0, 0.061, 11, 0, 0.02549, 0, 0.00794\}$;
The LSF-Model of $\alpha_{MP}$ with $\mu=0$, $\lambda=1$ (Property-16/[1]) is used to obtain the lattice structure of $x_{SM}$ as follows.
The Lattice structure for $h_{B0}=\alpha_{MP}^+$ in FIG. 3B, and Table B:
$[\alpha_{MP}^+:16]=\{1, 0.00794, 0.80594, 0.02549, 0.43368, 0.06111, 0.2388, 0.12618, 0.12618, 0.2388, 0.06111, 0.43368, 0.02549, 0.80594, 0.00794, 1\}$;
$u[0]=-0.5$; $k_U[0]=1$;
$[v:7]=\{0.04658, 0.11621, 0.17849, 0.2361, 0.2923, 0.35212, 0.41697\}$;
$[k_V:7]=\{-0.95748, -0.74508, -0.43437, -0.08723, 0.26264, 0.59852, 0.86697\}$;
The Lattice structure for $h_{B1}=\alpha_{MP}^-$ in FIG. 3B, and Table B:
$[\alpha_{MP}^-:16]=\{1, -0.00794, 0.80594, -0.02549, 0.43368, -0.06111, 0.2388, -0.12618, 0.12618, -0.2388, 0.06111, -0.43368, 0.02549, -0.80594, 0.00794, -1\}$;
$u[0]=0$; $k_U[0]=-1$;
$[v:7]=\{0.08303, 0.14788, 0.2077, 0.2639, 0.32151, 0.38379, 0.45342\}$;
$[K_V:7]=\{-0.86697, -0.59852, -0.26264, -0.08723, 0.43437, 0.74508, 0.95748\}$;
The Lattice structure for $h_{AB}=x_{AH}$ with $C_{AH}$:
$[u:2]=\{-0.5, 0\}$; $[k_U:2]=\{1, 1\angle(-0.5)\}$
The Lattice structure of $h_{LP}$ in FIG. 3B, and Table B:
$h_{AB}$, $h_{B0}$ and $h_{B1}$ as above; $N_U=4$; $N_V=14$;
$G_0=G_{MP}=0$; $G_1=K_{SM}h_{LP}[0]$;

Example-10

Consider the sequence x used in Example-1/[1]. The lattice structure for $X(z)$ can be realized with three CFM blocks based on the LSF-A model of x as in FIG. 5. The lattice structures of the transfer functions $X_{LP}(z)$, $X_{MP}(z)$, $X_{NP}(z)$ are given by Example-3 to Example-7.

Example 11

The LSF-C Model of x (Table III/[1]) uses the LP-sequences x+/NA of the NA-sequence $X_{NA}$ with two model parameters $\mu_{VEC}[0]$ and $\lambda_{VEC}[1]$. These sequences corresponding to x in Example-1/[1] can be summarized as follows.
$\mu_{VEC}[0]=0$; $\lambda_{VEC}[1]=1$;
$[x_{NA}:13]=\{1, 2.55782 \angle(0.23427), 0.71216 \angle(-0.06613), 9.6506 \angle(0.21362), 5.0452 \angle(0.43954), 17.30626 \angle(0.25938), 20.89266 \angle(0.49388), 6.69387 \angle(-0.28057), 8.59387 \angle(-0.3042), 3.93104 \angle(-0.11924), 0.9 \angle(-0.17)\}$;
$[x_{NA}^+:14]=\{1, 3.40384 \angle(0.21771), 4.26286 \angle(0.09472), 17.5132 \angle(0.25621), 10.33535 \angle(0.34788), 34.97506 \angle(0.35336), 31.25423 \angle(-0.46996), 31.25423 \angle(0.46996), 34.97506 \angle(-0.35336), 10.33535 \angle(-0.34788), 17.5132 \angle(-0.25621), 4.26286 \angle(-0.09472), 3.40384 \angle(-0.21771), 1\}$;
$[x_{NA}^-:14]=\{1, 1.76599 \angle(0.26636), 3.70791\angle(-0.35253), 5.22162 \angle(0.04002), 5.80555 \angle(-0.34985), 20.25041 \angle(0.05364), 13.34237 \angle(0.40543), 13.34237 \angle(0.09457), 20.25041\angle(0.44636), 5.80555 \angle(-0.15015), 5.22161\angle(0.45998), 3.70791 \angle(-0.14747), 1.76599 \angle(0.23364), 1\angle(-0.5)\}$;
From Property-15/[1] when $X_1(z)=X_{NLP}(z)$, $X+/1(z)=X+/NLP(z)$ are LP-sequences with the following characteristics.
The LP-sequence $x_1^+=x_{NLP}^+$ (Table-I)
$[x_P^{AH}: 2]=\{1, 1\angle(-0.16352)\}$; $\theta_+[0]=0.33648$;
$[x_P^{SM}:13]=\{1, 4.19339 \angle(0.24359), 0.39525 \angle(0.30931), 17.21118 \angle(0.25855), 20.23433 \angle(-0.49028), 14.78917 \angle(0.36315), 40.53399 \angle(-0.41824), 14.78917 \angle(-0.19963), 20.23433 \angle(-0.3462), 17.21118 \angle(-0.09503), 0.39525 \angle(-0.14579), 4.19339 \angle(0.08007), 1 \angle(0.16352)\}$;
$K_P^{SM}=20.26699 \angle(-0.41824)$;
$[a_{MP}: 7]=\{1, 0.72972 \angle(0.21861), 0.99839 \angle(0.07204), 0.84922 \angle(0.32321), 0.20691\angle(0.33817), 0.04934 \angle(-0.41824)\}$;
The LP-sequence $x_1^-=x_{NA}^-$ (Table-II):
$[x_Q^{AH}:4]=\{1, 0.65985 \angle(0.29338), 0.65985 \angle(0.08789), 1\angle(0.38126)\}$;
$[\theta_-:3]=\{-0.30051, -0.11212, 0.29389\}$;
$x_Q^{SM}:11]$ $\{1, 1.12118 \angle(0.25052), 3.73919 \angle(-0.34372), 3.91145 \angle(0.03109), 3.96567 \angle(-0.30722), 11.78647 \angle(0.05937), 3.96567 \angle(0.42595), 39.1145 \angle(0.08764), 3.73919 \angle(0.46245), 1.12118 \angle(-0.13178), 1\angle(0.11874)\}$;
$K_Q^{SM}=5.89323 \angle(0.05937)$;
$[a_{MP}: 6]=\{1, 0.67292 \angle(0.36659), 0.66372 \angle(0.02827), 0.63449 \angle(0.40308), 0.19025 \angle(-0.19115), 0.16969 \angle(0.05937)\}$;

Example-12

Consider the LP-sequence $x_{NA}^+$ in Example 11. The lattice structure for the transfer function $z^{-D_{PQ}}X_{NA}^+(z)$ can be obtained with one CFM block in $C_{LP}$ (FIG. 3B, and Table B) as in Table-I.

Structure for $h_{AB}=x_P^{AH}$:
$L_u=1$; $L_v=0$; $k_u[0]=1 \angle(-0.16352)$
Structure for $h_{B0}=a_{MP}^+$
$[a_{MP}^+:8]=\{1, 0.74655 \angle(0.22861), 0.83094 \angle(0.05079), 0.83321\angle(0.32532), 0.83321 \angle(-0.32532), 0.83094 \angle(-0.05079), 0.74655 \angle(-0.22861), 1\}$;
$[u:7]=\{-0.45843, -0.28614, -0.25115, -0.1379, 0.05259, 0.27522, 0.30522\}$; $L_v=0$;
$[k_u:7]=\{1 \angle(0.04157), 1 \angle(0.21386), 1 \angle(0.24885), 1 \angle(0.3627), 1\angle(-0.44741), 1\angle(-0.22478), 1\angle(-0.19478)\}$;
Structure for $h_{B1}=a_{MP}^-$
$[a_{MP}^-:8]=\{1, 0.7159 \angle(0.20818), 1.17844 \angle(0.087), 0.86538 \angle(0.32118), 0.86538 \angle(0.17882), 1.17844 \angle(0.413), 0.7159 \angle(0.29182), 1 \angle(-0.5)\}$;
$[u: 7]=\{-0.36011, -0.25475, -0.20589, -0.06398, 0.1817, 0.2996, 0.40343;\}$ $L_v=0$;
$[k_U: 7]=\{1\angle(0.13989), 1\angle(0.24525), 1 \angle(0.29411), 1 \angle(0.43602), 1\angle(-0.3183), 1 \angle(-0.2004), 1\angle(0.09657)\}$;
Structure for $x_{NA}^+$:
$h_{AB}$, $h_{B0}$ and $h_{B1}$ as above; $N_u=15$; $N_v=0$;
$G_0=G_{MP}=0$; $G_1=K_P^{SM}$; $D_1=D_P=0$;

Example-13

Consider the LP-sequence $x_{NA}^-$ in Example-11. The lattice structure for the transfer function $z^{-D_{PQ}}X_{NA}^-(z)$ can be obtained with one DFM block in $C_{LP}$ (FIG. 3B, and Table B) as in Table-I.
Structure for $h_{AB}=x_Q^{AH}$
$[k_u: 3]=\{1\angle(0.19949), 1\angle(0.38788), 1 \angle(-0.20611)\}$; $L_u=3$; $L_v=0$;
Structure for $h_{B0}=a_{MP}^+$:
$[a_{MP}^+:7]=\{1, 0.5268 \angle(0.34351), 0.77985 \angle(0.06167), 1.04089 \angle(-0.5), 0.77985 \angle(-0.06167), 0.5268 \angle(-0.34351), 1\}$;
$[u: 6]=\{-0.34452, -0.24261, -0.11914, 0.05795, 0.27851, 0.36985\}$; $L_v=0$;
$[k_u: 6]=\{1\angle(0.15548), 1 \angle(0.25739), 1 \angle(0.38086), 1 \angle(-0.44205), 1 \angle(-0.22149), 1 \angle(-0.13018)\}$;
Structure for $h_{B1}=a_{MP}^-$:
$[a_{MP}^-:7]=\{1, 0.82808 \angle(0.38124), 0.5876 \angle(-0.01631), 0.72585 \angle(0.25), 0.5876 \angle(-0.48369), 0.82808 \angle(0.11876), 1\angle(-0.5)\}$;
$[u: 6]=\{-0.46741, -0.27206, -0.15692, -0.06125, 0.16833, 0.28931\}$; $L_v=0$;
$[k_u: 6]=\{1 \angle(0.03259), 1 \angle(0.22794), 1\angle(0.34308), 1 \angle(0.43875, 1 \angle(-0.33167), 1\angle(-0.21069)\}$;
Structure for $x_{NA}^-$:
$h_{AB}$, $h_{B0}$ and $h_{B1}$ as above; $N_u=15$; $N_v=0$;
$G_0=G_{MP}=0$; $G_1=K_Q^{SM}$; $D_1=D_Q=0$;

Example-14

Consider the sequence x used in Example-1/[1]. The lattice structure for X(z) can be realized with the LSF-C model of x using the configuration $C_c$ (FIG. 6).
$CFM_1$ in configuration (4.1) as in Example-3.
$CFM_2$ in configuration (4.2) as in Example-12.
$CFM_3$ in configuration (4.3) as in Example-13.

Example 15

The LSF-D Model of x (Table-III/[1]) uses the LP-sequences $x_{NLP}^+$ of the NLP-sequence $x_{NLP}$ with two model parameters $\mu_{VEC}[0]$ and $\lambda_{VEC}[1]$. These sequences corresponding to x in Example-1/[1] can be summarized as follows.
$\mu_{VEC}[0]=0$; $\lambda_{VEC}[1]=1$;
$[x_{NLP}: 7]=\{1, 1.49755 \angle(0.17643), 2.16042 \angle(-0.08347), 5.69442 \angle(0.11206), 4.02355 \angle(0.02943), 4.71534 \angle(0.11175), 0.9 \angle(0.03)\}$;
$[x_{NLP}^+:8]=\{1, 1.94459 \angle(0.10293), 6.85239 \angle(-0.10288), 8.803 \angle(0.05432), 8.803 \angle(-0.05432), 6.85239 \angle(0.10288), 1.94459 \angle(-0.10293), 1\}$;
$[x_{NLP}^-:8]=\{1, 1.52443 \angle(0.27265), 2.61695 \angle(0.36494), 4.44274 \angle(0.23618), 4.44274 \angle(0.26382), 2.61695 \angle(0.13506), 1.52443 \angle(0.22735), 1\angle(-0.5)\}$;
From Property-15[1] when $X_1(z)=X_{NLP}^-(z)$, $X+/1(z)=X+/NLP(z)$ are LP-sequences with the following characteristics.
The LP-sequence $x_1^+=x_{NLP}^+$ (Table-I):
$[x_P^{AH}: 4]=\{1, 1.13644 \angle(0.19318), 1.13644 \angle(0.11361), 1\angle(0.30679)\}$;
$[\theta_-: 3]=\{0.26528, -0.23866, 0.31074\}$;
$[x_P^{SM}: 5]=\{1, 1.15973 \angle(0.0147), 7.47951 \angle(-0.1534), 1.15973 \angle(-0.32149), 1\angle(-0.30679)\}$;
$K_P^{SM}=3.73976 \angle(-0.1534)$;
$[a_{MP}: 3]=\{1, 0.31011\angle(-0.16809), 0.2674 \angle(-0.1534)\}$;
The LP-sequence $x_1^-=x_{NLP}^-$ (Table-II):
$[x_Q^{AH}:4]=\{1, 0.96522 \angle(-0.2331), 0.96522 \angle(-0.13248), 1 \angle(-0.36558)\}$;
$[\theta_-:3]=\{-0.3155, 0.17436, 0.27556\}$;
$[x_Q^{SM}:5]=\{1, 2.48927 \angle(0.27042), 5.17073 \angle(0.43279), 2.48927 \angle(-0.40484), 1 \angle(-0.13442)\}$;
$K_Q^{SM}=2.58536 \angle(0.43279)$;
$[a_{MP}: 3]=\{1, 0.96283 \angle(0.16237), 0.38679 \angle(0.43279)\}$;

Example-16

Consider the LP-sequence $x_{NLP}^+$ in Example-15. The lattice structure for the transfer function $z^{-D_{PQ}}X_{NLP}^+(Z)$ can be obtained with one DFM block in $C_{LP}$ (FIG. 3B, and Table B) as in Table-I.
Structure for $h_{AB}=x_P^{AH}$:
$L_U=3$; $L_V=0$;
$[k_u:3]=\{1 \angle(0.23472), 1 \angle(0.26134), 1 \angle(-0.18926)\}$;
Structure for $h_{B0}=a_{MP}^+$:
$[a_{MP}^+:4]=\{1, 0.30928 \angle(-0.026), 0.30928 \angle(0.026), 1\}$;
$[u:3]=\{-0.19061, 0.19655, 0.49406\}$; $L_V=0$;
$[k_u:3]=\{1 \angle(0.30939), 1 \angle(-0.30345), 1 \angle(-0.00594)\}$;
Structure for $h_{B1}=a_{MP}^-$:
$[a_{MP}^-:4]=\{1, 0.48958\angle(-0.24996), 0.48958 \angle(-0.25004), 1 \angle(-0.5)\}$;
$[u:3]=\{-0.3562, 0.05344, 0.30275\}$; $L_V=0$;
$[k_u:3]=\{1\angle(0.1438), 1 \angle(-0.44656), 1\angle(-0.19725)\}$;
Structure for $x_{NLP}^+$:
$h_{AB}$, $h_{B0}$ and $h_{B1}$ as above; $N_u=9$; $N_v=0$;
$G_0=G_{MP}=0$; $G_1=K_P^{SM}$; $D_1=D_P0$;

Example-17

Consider the LP-sequence $x_{NLP}^-$ in Example-15. The lattice structure for the transfer functions $z^{-D_{PQ}} X_{NLP}^-(z)$ can be obtained with one CFM block $C_{LP}$ (FIG. 3B, and Table B) as in Table-I.
Structure for $h_{AB}=x_Q^{AH}$:
$L_U=3$; $L_V=0$;
$[k_U:3]=\{1 \angle(0.1845), 1 \angle(-0.32564), 1 \angle(-0.22444)\}$;
Structure for $h_{B0}=a_{MP}^+$:
$[a_{MP}^+:4]=\{1, 0.679\}; \angle(0.21432), 0.679 \angle(-0.21432), 1\}$;
$[u:3]=\{-0.42083, -0.22832, 0.14915\}$; $L_V=0$;
$[k_u:3]=\{1 \angle(0.07917), 1 \angle(0.27168), 1 \angle(-0.35085)\}$;
Structure for $h_{B1}=a_{MP}^-$
$[\alpha_{MP}^-:4]=\{1, 1.30087 \angle(0.13561), 1.30087 \angle(0.36439), 1 \angle(-0.5)\}$;
$[u:3]=\{-0.3822, -0.08502, 0.46722\}$; $L_V=0$;
$[k_u:3]=\{1\angle(0.1178), 1 \angle(0.41498), 1\angle(-0.03278)\}$;
Structure for $x_{NLP}^-$:
$h_{AB}$, $h_{B0}$ and $h_{B1}$ as above; $N_u=9$; $N_v=0$;
$G_0=G_{MP}=0$; $G_1=K_Q^{SM}$; $D_1=D_Q=0$;

Example-18

Consider the sequence x used in Example-1/[1]. The lattice structure for X(z) can be realized with the LSF-D model of x using the configuration $C_D$ (FIG. 6).

CFM$_1$ in configuration (4.1) as in Example-7.
CFM$_2$ in configuration (4.2) as in Example-16.
CFM$_3$ in configuration (4.3) as in Example-17.

Example-19

Consider a rational transfer function defined by the following Matlab function (Chapter-4, page 65[11]);
[b, a]=ellip(4, 1, 60, 0.01);
Consider two sequences h$_{NUM}$ and h$_{DEN}$ with coefficients as the Matlab output vectors b and a respectively.
Characteristics of h$_{NUM}$:
h$_{NUM}$[0]=0.001; H$_{12}$(z) $\triangleq$ H$_{NUM}$(z)/h$_{NUM}$[0];
[h$_{12}$:5]={1, 3.95562, 5.9115, −3.95562, 1};
L$_V$=0, L$_V$=2; [v:2]={0.01323, 0.03086};
The Lattice structure for h$_{AB}$=h$_{12}$ with C$_{AH}$:
[k$_v$:2]={−0.99655, −0.98126};
Characteristics of h$_{DEN}$ (MP-sequence):
[h$_{DEN}$:5]={1, −3.96921, 5.9091, −3.91054, 0.97065};
[h$_{34}$:4]={1, −1.48873, 0.98522, −0.24455};
The LSF-Model of h$_{34}$=a$_{MP}$ (MP-sequence) with μ=0, λ=1 (Property-16/[1]) is used to obtain its lattice structure as follows.
The Lattice structure for h$_{B0}$=a$_{MP}^+$ in FIG. 3B, and Table B:
[a$_{MP}^+$:4]={1, −0.66651, −0.66651, 1};
u[0]=−0.5; k$_u$[0]=1;
v[0]=0.09324; k$_V$[0]= −0.83325;
The Lattice structure for h$_{B1}$=a$_{MP}^-$ in FIG. 3B, and Table B:
[a$_{MP}^-$:4]={1, −1.98784, −1.98784, 1};
u[0]=−0; k$_u$[0]=−1;
v[0]=0.16778; k$_V$[0] −0.49392;
The Lattice structure of h$_{34}$ in FIG. 3B, and Table B:
h$_{B0}$ and h$_{B1}$ as above; G$_0$=G$_{MP}$=−0.24455;
The Lattice structure for H$_{05}$(z) in FIG. 7:
A C F M$_1$ block with h$_{AB}$ as above with N$_U$=0; N$_v$=2;
A C F M$_2$ block for h$_{34}$ as above with N$_U$=2; N$_v$=2;

Example-20

Consider the following sequence x.
Characteristics of x (Table-II/[1]):

$$[x:11] = \left\{\begin{array}{l} 1, 3.90954\angle(0.44862), 17.99403\angle(-0.07946), \\ 36.37737\angle(0.28518), 52.18123\angle(-0.30352), \\ 62.45664\angle(0.20104), 62.00177\angle(-0.27873), \\ 48.11173\angle(0.18008), 19.93911\angle(-0.42051), \\ 3.6278\angle(0.03468), 0.64\angle(0.49) \end{array}\right\}$$

$[u:2] = \{0.09, 0.3\}; \alpha_{AH} = -0.39; \alpha_{LP} = 0.21;$ $[x_v:3] = \{1, 1.58031\angle(-0.305), 1\angle(0.39)\};$ $[\rho_M:2] = \{0.4\angle(-0.27), 0.2\angle(0.16)\}$ $[x_m:3] = \{1, 0.23501\angle(0.28901), 0.08\angle(-0.11)\};$ $[\rho_N:2] = \{0.5\angle(-0.37), 0.25\angle(0.18)\};$ $[x_N:3] = \{1, 2.18703\angle(-0.2744), 8\angle(-0.19)\};$ $[\rho_c:2] = \{0.3\angle(-0.2), 0.8\angle(0.1)\};$ $[x_c:5] = \left\{\begin{array}{l} 1, 5.42727\angle(0.33563), 9.06637\angle(-0.3), \\ 5.42727\angle(0.06437), 1\angle(0.4) \end{array}\right\};$ $[x_{LP}:7] = \left\{\begin{array}{l} 1, 4.59033\angle(0.37851), 7.98373\angle(-0.14618), \\ 9.0607\angle(03.95), 7.98373\angle(-0.06382) \\ 4.59033\angle(0.41149), 1\angle(-0.21) \end{array}\right\};$ Here, X$_{AH}$(z)=X$_U$(z) and X$_{SM}$(z)=X$_C$(z). The lattice structure for X$_{AH}$(z) can be realized with one CFM block in C$_{AH}$ (FIG. 3B, and Table B).
The Lattice structure for h$_{AB}$=x$_{AH}$ with C$_{AH}$:
[k$_U$: 2]={1∠(−0.41), 1∠(−0.2)}; N$_U$=2; N$_v$=0;
Characteristics of x$_{SM}$ (Property-2)
K$_{SM}$=4.53318∠(−0.3);
[α$_{MP}$:3]={1, 1.19723∠(0.36437), 0.2206∠(−0.3)};
The LSF-Model of α$_{MP}$ (FIG. 4/[1]) is obtained for μ$_{MP}$=0 and λ$_{MP}$=1
Example-1/[1]. The lattice structure for X$_{SM}$(z) can be realized with one CFM block in C$_{SM}$ (FIG. 3B, and Table B) as follows.
The Lattice structure for h$_{B0}$=α$_{mp}^+$ in FIG. 3B, and Table B:
[α$_{MP}^+$:4]={1, 1.40272∠(0.35451), 1.402724-0.35451), 1};
[u:3]={−0.40184, −0.1287, 0.03055}; L$_v$=0;
[k$_U$:3]={1∠(0.09816), 1∠(0.3713), 1∠(−0.46945)};
The Lattice structure for h$_{B1}$=α$_{MP}^-$ in FIG. 3B, and Table B:
[α$_{MP}^-$:4]={1, 0.99821∠(0.37823), 0.99821∠(0.12177, 1∠(−0.5)};
[u:3]={−0.18977, −0.12115, 0.31092}; L$_v$=0;
[k$_U$:3]={1∠(0.31023), 1∠(0.37885), 1∠(−0.18908)};
The Lattice structure of x$_{SM}$ in FIG. 3B, and Table B:
h$_{B0}$ and h$_{B1}$ as above; N$_U$=6; N$_v$=0;
G$_0$=G$_{MP}$=0; G$_1$=K$_{SM}$;

Example-21

Consider the sequence x in Example-20. The lattice structure of x$^\dagger$ (FIG. 9) can be obtained as follows. For A(z)=X$_{AH}$(z) the lattice structure of x$_{AH}$ can be realized with h$_{AB}$ as in Example-20.
Characteristics of x$_{NA}^\dagger$ (Property-2):

$$[x_{NA}:9] = \left\{\begin{array}{l} 1, 4.18335\angle(0.38699), \\ 16.53667\angle(-0.13655), 51.45607\angle(0.20062), \\ 82.90567\angle(-0.46869), 60.19101\angle(-0.12403), \\ 19.44521\angle(0.23597), 3.70248\angle(-0.31138), 0.64\angle(0.1) \end{array}\right\};$$

$x_{NA}^\dagger[0] = 0.64\angle(-0.1); R_{SM}(z) = X_{NA}^\dagger(z)/x_{NA}^\dagger[0];$ $K_x = 0.64\angle(-0.49); K_{SM} = 10803.3055\angle(0.1);$ $$[r_{SM}:17] = \left\{\begin{array}{l} 1, 9.93999\angle(0.40115), \\ 69.77673\angle(-0.15831), 363.72642\angle(0.2433), \\ 1289.8725\angle(-0.35621), 3973.67323\angle(0.04142), \\ 9959.15061\angle(0.40987), 17758.67585\angle(-0.24181), \\ 21606.61099\angle(0.1), 17758.67585\angle(0.44181), \\ 9959.15061\angle(-0.20987), 3973.67323\angle(0.15858), \\ 1289.8725\angle(-0.44379), 363.72642\angle(-0.0433), \\ 69.77673\angle(0.35831), 9.93999\angle(-0.20115), 1\angle(0.2) \end{array}\right\};$$

$$[\alpha_{MP}:9] = \left\{\begin{array}{l} 1, 1.64382\angle(0.34181), 0.92186\angle(-0.30987), \\ 0.36782\angle(0.05858), 0.1194\angle(0.45621), \\ 0.03367\angle(-0.1433), 0.00646\angle(0.25831), \\ 0.00092\angle(-0.30115), 0.00009\angle(0.1) \end{array}\right\};$$

The LSF-Model of $\alpha_{MP}$ (FIG. 4/[1]) is obtained for $\mu_{MP}=0$ and $\lambda_{MP}=1$. The lattice structure for $R_{SM}(z)$ can be realized with one CFM block in $C_{SM}$ (FIG. 3B, and Table B) as follows. The Lattice structure for $h_{B0}=\alpha_{MP}^+$ in FIG. 3B, and Table B:

$$[\alpha_{MP}^+:10] = \begin{Bmatrix} 1, 1.64373\angle(0.34181), \\ 0.92116\angle(-0.30997), 0.36523\angle(0.05601), \\ 0.11087\angle(0.411), 0.11087\angle(-0.411), \\ 0.36523\angle(-0.05601), 0.92116\angle(0.30997), \\ 1.64373\angle(-0.34181), 1 \end{Bmatrix};$$

$$[u:9] = \begin{Bmatrix} -0.45207, -0.33441, -0.22259, -0.15918, -0.1111, \\ 0.00073, 0.12011, 0.25341, 0.40509 \end{Bmatrix};$$

$L_v = 0$;

$$[k_v:9] = \begin{Bmatrix} 1\angle(0.04793), 1\angle(0.16559), 1\angle(0.27741), \\ 1\angle(0.34082), 1\angle(0.3889), 1\angle(-0.49927), 1\angle(-0.37989), \\ 1\angle(-0.24659), 1\angle(-0.09491) \end{Bmatrix};$$

The Lattice structure for $h_{B1} = \alpha_{MP}^-$ in Fig. 3B, and Table B:

$$[\alpha_{MP}^-:10] = \begin{Bmatrix} 1, 1.64391\angle(0.34182), \\ 0.92257\angle(-0.30977), 0.3705\angle(0.06111), \\ 0.13596\angle(0.49291), 0.13596\angle(0.00709), \\ 0.3705\angle(0.43889), 0.92257\angle(-0.19023), \\ 1.64391\angle(0.15818), 1\angle(-0.5) \end{Bmatrix};$$

$$[u:9] = \begin{Bmatrix} -0.3915, -0.27835, -0.16733, -0.15866, -0.05549, \\ 0.05893, 0.18461, 0.32753, 0.48027 \end{Bmatrix};$$

$L_v = 0$;

$[k_U:9] = \{1\angle(0.1085), 1\angle(0.22165), 1\angle(0.33267), 1\angle(0.34134),$
$1\angle(0.44451), 1\angle(-0.44107), 1\angle(-0.31539), 1\angle(-0.17247), 1\angle(-0.01973)\}$;

The Lattice structure of $r_{SM}$ of $x_{NA}$ in FIG. 9:
$h_{B0}$ and $h_{B1}$ as above; $N_U=18$; $N_V=0$;
$G_0=G_{MP}=0$; $G_1=K_{SM}$;

Example-22

Consider the sequence x in Example-20. The lattice structure of $x^\dagger$ (FIG. 9) can be obtained as follows. For $A(z)=X_{LP}(z)$ the lattice structure of $x_{LP}$ can be realized by one CFM block with $x_{AH}$ and $x_{SM}$ realized as in Example-20.
Characteristics of $X_{NLP}$ (Property-2):
$[x_{NLP}:5]=\{1, 1.97254\angle(-0.28176), 8.23189\angle(-0.17971), 1.70613\angle(0.09732), 0.64\angle(-0.3)\}$;
$x_{NLP}^\dagger[0]=0.64\angle(0.3), R_{SM}(z)=X_{NLP}^\dagger(z)/x_{NLP}^\dagger[0]$;
$K_x=0.64\angle(-0.49); K_{SM}=59.35585\angle(-0.3)$;
$[r_{SM}:9]=\{1, 4.34306\angle(-0.34857), 15.66228\angle(-0.13152), 35.88468\angle(-0.48307), 118.7117\angle(-0.3), 35.88468\angle(-0.11693), 15.66228\angle(-0.46848), 4.34306\angle(-0.25143), 1\angle(0.4)\}$;
$[\alpha_{MP}:5]=\{1, 0.60457\angle(0.18307), 0.26387\angle(-0.16848), 0.07317\angle(0.04857), 0.01685\angle(-0.3)\}$;
The LSF-Model of $\alpha_{MP}$ (FIG. 4/[1]) is obtained for $\mu_{MP}=0$ and $\lambda_{MP}=1$. The lattice structure for $R_{SM}(z)$ can be realized with one CFM block in $C_{SM}$(FIG. 3B, and Table B) as follows. The Lattice structure for $h_{B0}=\alpha_{MP}^+$ in FIG. 3B, and Table B:
$[\alpha_{MP}^+:6]=\{1, 0.61717\angle(0.18599), 0.32116\angle(-0.14357), 0.32116\angle(0.14357), 0.61717\angle(-0.18599), 1\}$;
$[u:5]=\{-0.43906, -0.31595, -0.14669, 0.09751, 0.3042\}$;
$L_V=0$;
$[k_U:5]=\{1\angle(0.06094), 1\angle(0.18405), 1\angle(0.35331), 1\angle(-0.40249), 1\angle(-0.1958)\}$;
The Lattice structure for $h_{B1}=\alpha_{MP}^-$ in FIG. 3B, and Table B:
$[\alpha_{MP}^-:6]=\{1, 0.59217\angle(0.18004), 0.21638\angle(-0.20564), 0.21638\angle(-0.29436), 0.59217\angle(0.31996), 1\angle(-0.5)\}$;
$[u:5]=\{-0.35871, -0.25423, -0.01776, 0.19714, 0.43356\}$;
$L_V=0$;
$[k_U:5]=\{1\angle(0.14129), 1\angle(0.24577), 1\angle(0.48224), 1\angle(-0.30286), 1\angle(-0.06644)\}$;
The Lattice structure of $r_{SM}$ of $x_{NLP}$ in FIG. 9:
$h_{B0}$ and $h_{B1}$ as above; $N_U=10$; $N_V=0$;
$G_0=G_{MP}=0$; $G_1=K_{SM}$.

The following publications [1] through [11] are hereby incorporated herein by reference for all purposes:

[1] S. S Yedlapalli and K V S Hari. The line spectral frequency model of a finite length sequence. IEEE Journal of Selected Topics in Signal Processing—Special issue on Model Order Selection for Signal Processing Systems, June-2010.
[2] Alan V. Oppenheim. The Discrete Time Signal Processing. PHI, 1987.
[3] S. S. Yedlapalli and K V S Hari. The Canonic Linear-Phase FIR Lattice Structures. National Conference on Communications, NCC2010, IIT-Madras, 29-31, Jan. 2010.
[4] M. H. Hayes. Statistical Digital Signal Processing. John Wiley & Sons, 2003.
[5] S. K. Mitra and J. F. Kaiser. Handbook for Digital Signal Processing. John Wiley & Sons, 1993.
[6] V. Madisetti and D. B. Williams. The digital signal processing handbook. CRC, 1998.
[7] F. Harris. Ultra low phase noise dsp oscillator. IEEE Signal Processing Magazine, 24 Jul. 2007.
[8] L. Vachhani, K. Sridharan, and Meher, P. K. Efficient cordic algorithms and architectures for low area and high throughput implementation. IEEE Transactions on Circuits and Systems II: Express Briefs, 56, January 2009.
[9] J. G. Proakis and M. Salehi. Communication systems engineering. Prentice-Hall, Inc. Upper Saddle River, N.J., USA, 1994.
[10] T. Q Nguyen and P. P Vaidyanathan. Two-channel perfect-reconstruction fir qmf structures which yield linear-phase analysis and synthesis filters. IEEE Transactions on Acoustics Speech and Signal Processing, 37, May 1989.
[11] T. B. Welch, C. H. G. Wright, and M. G. Morrow. Real-time digital signal processing from MATLAB to C with the TMS320C6x DSK. CRC, 2006.

The invention claimed is:
1. A method to determine a digital filter structure, the method comprising:
obtaining, by a processor, a transfer function of a digital filter, wherein the digital filter includes one or more filter components including an annihilating component, a minimum phase component, a non-minimum phase component, and a symmetric component;
creating a representation of the digital filter, wherein the representation represents each of the filter components as a set of interconnected notch filters, wherein each set of notch filters includes at least one of a first notch filter having a half-lattice structure, and a second notch filter having a full lattice structure; and
storing the representation in a memory.
2. The method of claim 1, further comprising:
decomposing the annihilating component as a series combination of one or more first notch filters and one or more second notch filters; and
decomposing the minimum phase component, the non-minimum phase component, and the symmetric compo- nent as series-parallel combination of one or more first notch filters and one or more second notch filters.

3. The method of claim 1, wherein the first notch filter and the second notch filter are represented as single port devices.

4. The method of claim 1, further comprising implementing at least one of the annihilating component, the minimum phase component, the non-minimum phase component, and/or the symmetric component using a canonic filter module.

5. The method of claim 1, further comprising determining lattice coefficients of the first notch filter and the second notch filter for each set of notch filters.

6. The method of claim 1, further comprising generating a data structure based on the representation, wherein the data structure defines the digital filter structure.

7. An article of manufacture including a non-transitory computer readable medium having instructions stored thereon that, in response to execution by a computing device, cause the computing device to perform operations comprising:
   obtaining a transfer function for a digital filter, wherein the digital filter includes one or more filter components including an annihilating component, a minimum phase component, a non-minimum phase component, and a symmetric component; and
   creating a representation of the digital filter, wherein the representation represents each of the filter components as a set of interconnected notch filters, wherein each set of notch filters includes at least one of a first notch filter having a half-lattice structure, and/or a second notch filter having a full lattice structure.

8. The article of manufacture of claim 7, wherein the operations further comprise:
   decomposing the annihilating component as a series combination of one or more first notch filters and one or more second notch filters; and
   decomposing the minimum phase component, non-minimum phase component, and the symmetric component as a series-parallel combination of one or more first notch filters and one or more second notch filters.

9. The article of manufacture of claim 7, wherein the operations further comprise decomposing each of the minimum phase component, the non-minimum phase component, and the symmetric component into annihilating subcomponents wherein each of the annihilating subcomponents include one or more first notch filters and one or more second notch filters.

10. The article of manufacture of claim 7, wherein the operations further comprise deriving parameters to program a canonic filter module to implement at least one of the annihilating component, the minimum phase component, the non-minimum phase component, and/or the symmetric component.

11. The article of manufacture of claim 7, wherein the operations further comprise determining lattice coefficients of the first notch filter and the second notch filter for each set of notch filters.

12. The article of manufacture of claim 7, wherein the operations further comprise generating a data structure that defines a digital filter structure based on the representation.

13. A device effective to filter digital signals, the device comprising:
   a processor, that includes one or more function modules, and the one or more function modules include at least one of an annihilating function module, a minimum phase function module, a non-minimum phase function module, and/or a symmetric function module,
   each of the function modules comprising a set of interconnected notch filters, wherein each set of notch filters includes at least one of a first notch filter having a half-lattice structure, and/or a second notch filter having a full lattice structure.

14. The device of claim 13, wherein the annihilating function module includes a series combination of one or more first notch filters and one or more second notch filters.

15. The device of claim 13, wherein the symmetric function module includes a series-parallel combination of one or more first notch filters and one or more second notch filters.

16. The device of claim 13, further comprising a canonic filter function module configured as a function module selected from a group that includes an annihilating function module, a minimum phase function module, a non-minimum phase function module, and a symmetric function module.

17. The device of claim 13, wherein the first notch filter includes a first delay circuit, a first multiplier circuit, and a first adder circuit.

18. The device of claim 17, wherein the second notch filter includes a second delay circuit and a third delay circuit, a second multiplier circuit and a third multiplier circuit, and a second adder circuit, a third adder circuit, and a fourth adder circuit.

19. The device of claim 13, wherein the first notch filter is implemented with a rotate-and-accumulate operation.

20. The device of claim 13, wherein the second notch filter is implemented with a real multiply-and-accumulate operation.

21. The device of claim 13, further comprising a memory coupled to the processor and configured to store sets of half-lattice and full-lattice coefficients that respectively correspond to each set of interconnected notch filters.

* * * * *

UNITED STATES PATENT AND TRADEMARK OFFICE
CERTIFICATE OF CORRECTION

PATENT NO. : 9,112,479 B2
APPLICATION NO. : 13/265288
DATED : August 18, 2015
INVENTOR(S) : Yedlapalli et al.

Page 1 of 1

It is certified that error appears in the above-identified patent and that said Letters Patent is hereby corrected as shown below:

Specification

In Column 1, Line 8, delete "371" and insert -- § 371 --, therefor.

In Column 1, Line 10, delete "119(a)" and insert -- § 119(a) --, therefor.

In Column 7, Lines 40-41, delete "$L_u$ blocks....lattice" and insert the same at line 39, after "of" as a continuation paragraph.

Signed and Sealed this
Twenty-ninth Day of March, 2016

Michelle K. Lee
*Director of the United States Patent and Trademark Office*